(12) United States Patent
Wang et al.

(10) Patent No.: US 12,484,257 B2
(45) Date of Patent: *Nov. 25, 2025

(54) METHOD OF FORMING GATE STRUCTURES FOR NANOSTRUCTURES

(71) Applicant: Taiwan Semiconductor Manufacturing Co., Ltd., Hsinchu (TW)

(72) Inventors: Chunchieh Wang, Kaohsiung (TW); Yueh-Ching Pai, Taichung (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 618 days.

This patent is subject to a terminal disclaimer.

(21) Appl. No.: 17/314,752

(22) Filed: May 7, 2021

(65) Prior Publication Data

US 2022/0278197 A1    Sep. 1, 2022

Related U.S. Application Data

(60) Provisional application No. 63/153,995, filed on Feb. 26, 2021.

(51) Int. Cl.
*H10D 30/67*   (2025.01)
*H01L 21/02*   (2006.01)
(Continued)

(52) U.S. Cl.
CPC ..... *H10D 30/6757* (2025.01); *H01L 21/0228* (2013.01); *H01L 21/02603* (2013.01);
(Continued)

(58) Field of Classification Search
CPC .......... H01L 29/78696; H01L 21/0228; H01L 21/02603; H01L 29/0673; H01L 29/42392;
(Continued)

(56) References Cited

U.S. PATENT DOCUMENTS 9,209,247 B2   12/2015   Colinge et al.
9,236,267 B2   1/2016    De et al.
(Continued)

FOREIGN PATENT DOCUMENTS

CN    107346783 A      11/2017
DE    102020111602 A1  10/2021
(Continued)

*Primary Examiner* — Eva Y Montalvo
*Assistant Examiner* — Zhijun Xu
(74) *Attorney, Agent, or Firm* — Slater Matsil, LLP

(57) ABSTRACT

An embodiment includes a device having a first set of nanostructures on a substrate, the first set of nanostructures including a first channel region, a second set of nanostructures on the substrate, the second set of nanostructures including a second channel region, a gate dielectric layer wrapping around each of the first and second sets of nanostructures, a first work function tuning layer on the gate dielectric layer of the first set of nanostructures, the first work function tuning layer wrapping around each of the first set of nanostructures, a glue layer on the first work function tuning layer, the glue layer wrapping around each of the first set of nanostructures, a second work function tuning layer on the glue layer of the first set of nanostructures and on the gate dielectric layer of the second set of nanostructures, and a fill layer on the second work function tuning layer.

20 Claims, 29 Drawing Sheets

(51) Int. Cl.
*H10D 30/01* (2025.01)
*H10D 30/43* (2025.01)
*H10D 62/10* (2025.01)
*H10D 64/01* (2025.01)

(52) U.S. Cl.
CPC .......... *H10D 30/014* (2025.01); *H10D 30/43* (2025.01); *H10D 30/6735* (2025.01); *H10D 62/121* (2025.01); *H10D 64/017* (2025.01)

(58) Field of Classification Search
CPC ......... H01L 29/66439; H01L 29/66545; H01L 29/775; H01L 27/092; H01L 21/28088; H01L 21/823842; H01L 29/4966; H01L 29/6656; H01L 21/823807; H01L 21/823821; H01L 21/823828; H01L 21/823857; H01L 27/0924
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,997,519 B1* | 6/2018 | Bao | H01L 27/092 |
| 10,418,363 B2 | 9/2019 | Chiang et al. | |
| 11,387,346 B2* | 7/2022 | Huang | H01L 29/66439 |
| 2015/0061042 A1 | 3/2015 | Cheng et al. | |
| 2016/0013289 A1 | 1/2016 | Xu | |
| 2016/0376704 A1* | 12/2016 | Raisanen | C23C 16/45525 |
| 2017/0005195 A1* | 1/2017 | Ching | H01L 29/42392 |
| 2018/0040621 A1 | 2/2018 | Liaw | |
| 2018/0294191 A1* | 10/2018 | Bao | H01L 29/66772 |
| 2019/0103496 A1 | 4/2019 | Colinge et al. | |
| 2019/0115349 A1 | 4/2019 | Liaw | |
| 2019/0304848 A1* | 10/2019 | Cheng | B82Y 10/00 |
| 2020/0013904 A1 | 1/2020 | Tsai et al. | |
| 2020/0066859 A1 | 2/2020 | Ando et al. | |
| 2020/0118888 A1 | 4/2020 | Bao et al. | |
| 2020/0168825 A1 | 5/2020 | van Dal et al. | |
| 2020/0328213 A1 | 10/2020 | Cheng et al. | |
| 2020/0365590 A1 | 11/2020 | Liaw | |
| 2020/0411387 A1 | 12/2020 | Chiang et al. | |
| 2021/0083078 A1 | 3/2021 | Kelly et al. | |
| 2021/0175345 A1 | 6/2021 | Hung et al. | |
| 2021/0336033 A1 | 10/2021 | Huang et al. | |
| 2021/0366785 A1 | 11/2021 | Cheng et al. | |

FOREIGN PATENT DOCUMENTS

| | | |
|---|---|---|
| TW | 201608640 A | 3/2016 |
| TW | 201715615 A | 5/2017 |
| TW | 201824565 A | 7/2018 |
| TW | 202020948 A | 6/2020 |
| TW | 202029340 A | 8/2020 |
| TW | 202044414 A | 12/2020 |

* cited by examiner

METHOD OF FORMING GATE STRUCTURES FOR NANOSTRUCTURES

PRIORITY CLAIM AND CROSS-REFERENCE

This application claims the benefit of U.S. Provisional Application No. 63/153,995, filed on Feb. 26, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
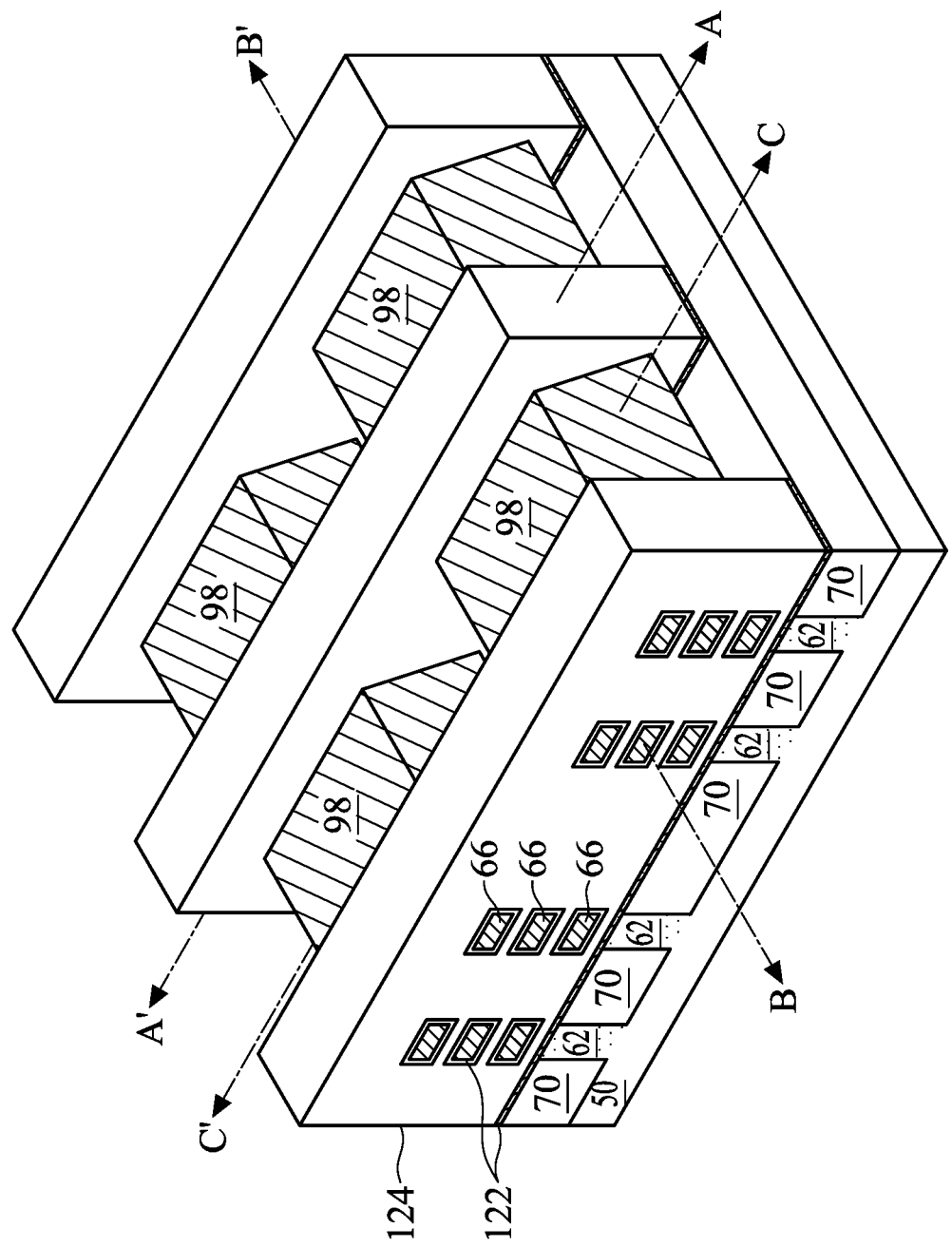
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, replacement gate electrodes for p-type devices and n-type devices are formed. In some embodiments, the work function tuning layers for the n-type devices are formed before the work function tuning layers for the p-type devices to allow more control of the threshold voltages of the resulting devices. The method of forming the work function tuning layers for the n-type devices before the work function tuning layers for the p-type devices includes the formation and patterning of sacrificial layers to prevent the work function tuning layers for the n-type devices from being formed between the nano structures of the p-type devices. This helps to prevent the work function tuning layers from remaining on the p-type devices which could degrade the performance of the p-type devices. In some embodiments, a protection layer is formed between the work function tuning layer and a glue layer to inhibit (e.g., substantially prevents or at least reduces) diffusion of the work function tuning layer. The threshold voltages of the resulting devices may thus be more accurately tuned.

Embodiments are described in a particular context, a die including nano-FETs. Various embodiments may be applied, however, to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 70, such as shallow trench isolation (STI) regions, are disposed between adjacent fins 62, which may protrude above and from between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials. In this context, the fins 62 refer to the portion extending above and from between the adjacent isolation regions 70.

Gate dielectrics 122 are over top surfaces of the fins 62 and along top surfaces, sidewalls, and bottom surfaces of the nanostructures 66. Gate electrodes 124 are over the gate dielectrics 122. Epitaxial source/drain regions 98 are disposed on the fins 62 at opposing sides of the gate dielectrics 122 and the gate electrodes 124. The epitaxial source/drain regions 98 may be shared between various fins 62. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 124 and in a direction, for example, perpendicular to a direction of current flow between the epitaxial source/drain regions 98 of a nano-FET. Cross-section B-B' is along a longitudinal axis of a fin 62 and in a direction of, for example, a current flow between the epitaxial source/drain regions 98 of the nano-FET. Cross-section C-C' is parallel to cross-section A-A' and extends through epitaxial source/drain regions 98 of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

FIGS. 2 through 27B are views of intermediate stages in the manufacturing of nano-FETs, in accordance with some embodiments. FIGS. 2, 3, 4, 5, and 6 are three-dimensional views showing a similar three-dimensional view as FIG. 1. FIGS. 7A, 8A, 9A, 10A, 11A, 12A, 13A, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, 26A, and 27A illustrate reference cross-section A-A' illustrated in FIG. 1, except two fins are shown. FIGS. 7B, 8B, 9B, 10B, 11B, 12B, 13B, 25B, 26B, 27B illustrate reference cross-section B-B' illustrated in FIG. 1. FIGS. 9C and 9D illustrate reference cross-section C-C' illustrated in FIG. 1, except two fins are shown.

Figure 2:
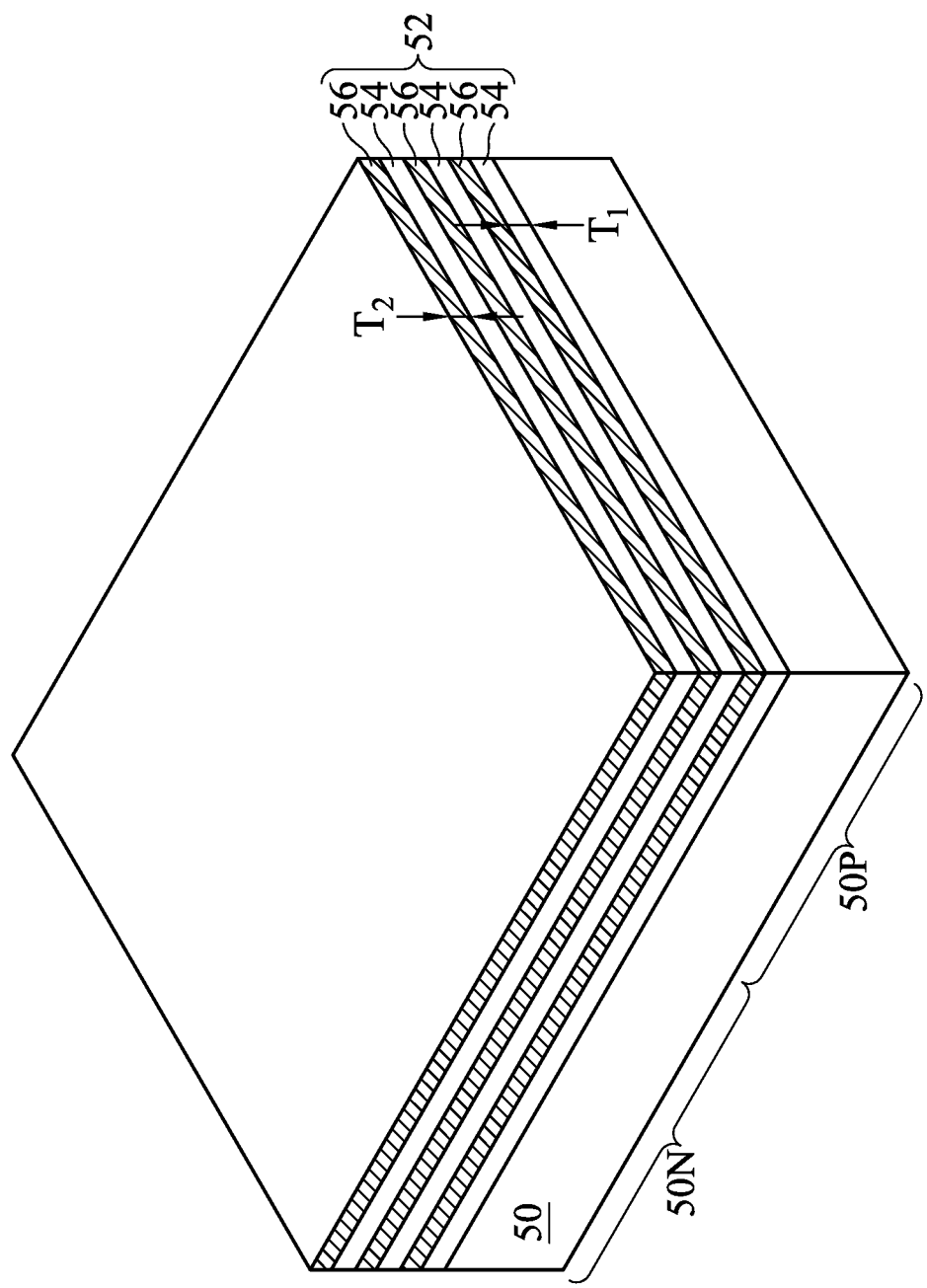
FIGS. 2 through 27B are views of intermediate stages in the manufacturing of nano-FETs, in accordance with some embodiments.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or a n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the doping concentration in the APT region may be in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56.

In the illustrated embodiment, and as will be subsequently described in greater detail, the first semiconductor layers 54 will be removed and the second semiconductor layers 56 will be patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in a range from 5 nm to 30 nm. In some embodiments, some layers (e.g., the second semiconductor layers 56) are formed to be thinner than other layers (e.g., the first semiconductor layers 54). For example, in embodiments in which the first semiconductor layers 54 are sacrificial layers (or dummy layers) and the second semiconductor layers 56 are patterned to form channel regions for the nano-FETs in both the n-type region 50N and the p-type region 50P, the first semiconductor layers 54 can have a first thickness $T_1$ and the second semiconductor layers 56 can have a second thickness $T_2$, with the second thickness $T_2$ being from 30% to 60% less than the first thickness $T_1$. Forming the second semiconductor layers 56 to a smaller thickness allows the channel regions to be formed at a greater density.

Figure 3:
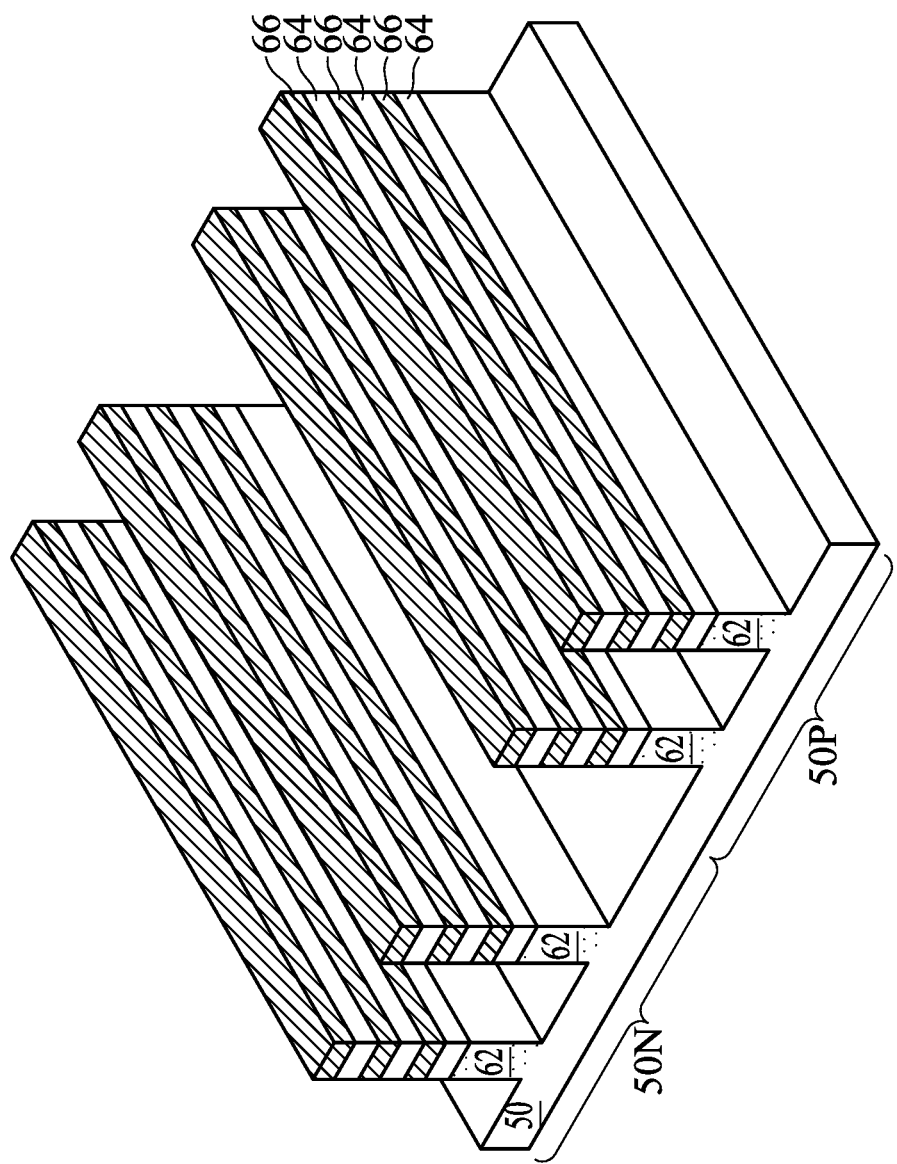

In FIG. 3, trenches are patterned in the substrate 50 and the multi-layer stack 52 to form fins 62, first nanostructures 64, and second nanostructures 66. The fins 62 are semiconductor strips patterned in the substrate 50. The first nanostructures 64 and the second nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66.

The fins 62 and the nanostructures 64, 66 may each have widths in a range from 8 nm to 40 nm. In the illustrated embodiment, the fins 62 and the nanostructures 64, 66 have substantially equal widths in the n-type region 50N and the p-type region 50P. In another embodiment, the fins 62 and the nanostructures 64, 66 in one region (e.g., the n-type region 50N) are wider or narrower than the fins 62 and the nanostructures 64, 66 in another region (e.g., the p-type region 50P).

Figure 4:
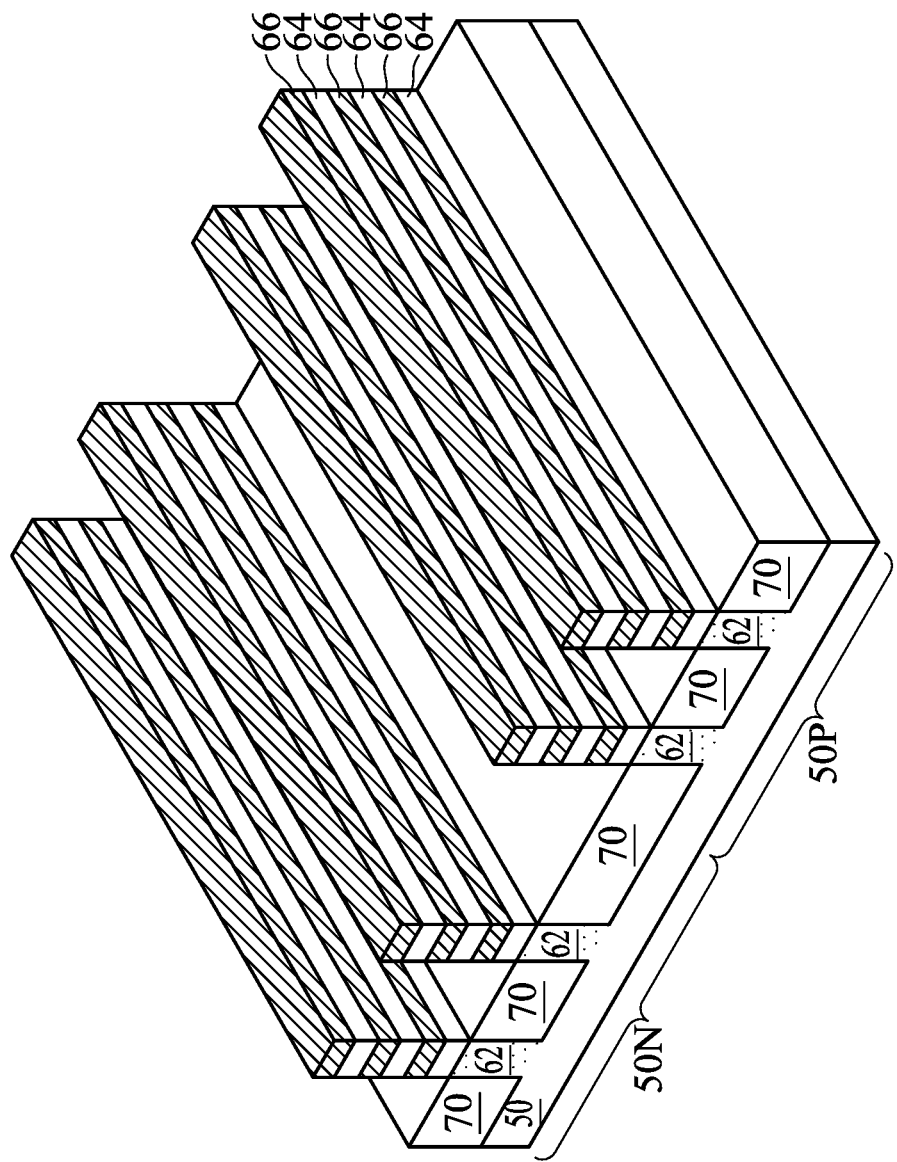

In FIG. 4, STI regions 70 are formed over the substrate 50 and between adjacent fins 62. The STI regions 70 are disposed around at least a portion of the fins 62 such that at least a portion of the nanostructures 64, 66 protrude from between adjacent STI regions 70. In the illustrated embodiment, the top surfaces of the STI regions 70 are coplanar (within process variations) with the top surfaces of the fins 62. In some embodiments, the top surfaces of the STI regions 70 are above or below the top surfaces of the fins 62. The STI regions 70 separate the features of adjacent devices.

The STI regions 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable CVD (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 70 are each illustrated as a single layer, some embodiments may utilize multiple layers. For example, in some embodiments a liner (not separately illustrated) may first be formed along surfaces of the substrate 50, the fins 62, and the nanostructures 64, 66. Thereafter, a fill material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. The planarization process exposes the nanostructures 64, 66 such that top surfaces of the nanostructures 64, 66 and the insulation material are coplanar (within process variations) after the planarization process is complete. In embodiments in which a mask remains on the nanostructures 64, 66, the planarization process may expose the mask or remove the mask such that top surfaces of the mask or the nanostructures 64, 66, respectively, and the insulation material are coplanar (within process variations) after the planarization process is complete. The insulation material is then recessed to form the STI regions 70. The insulation material is recessed such that at least a portion of the nanostructures 64, 66 protrude from between adjacent portions of the insulation material. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material may be recessed using any acceptable etching process, such as one that is selective to the material of the insulation material (e.g., selectively etches the insulation material of the STI regions 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the substrate 50, the fins 62, and/or the nanostructures 64, 66. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the fins 62, the nanostructures 64, 66, and the STI regions 70 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the fins 62, the nanostructures 64, 66, and the STI regions 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 62 and/or the nanostructures 64, 66, the grown materials may be in situ doped during growth, which may obviate the implantations, although in situ and implantation doping may be used together.

Figure 5:
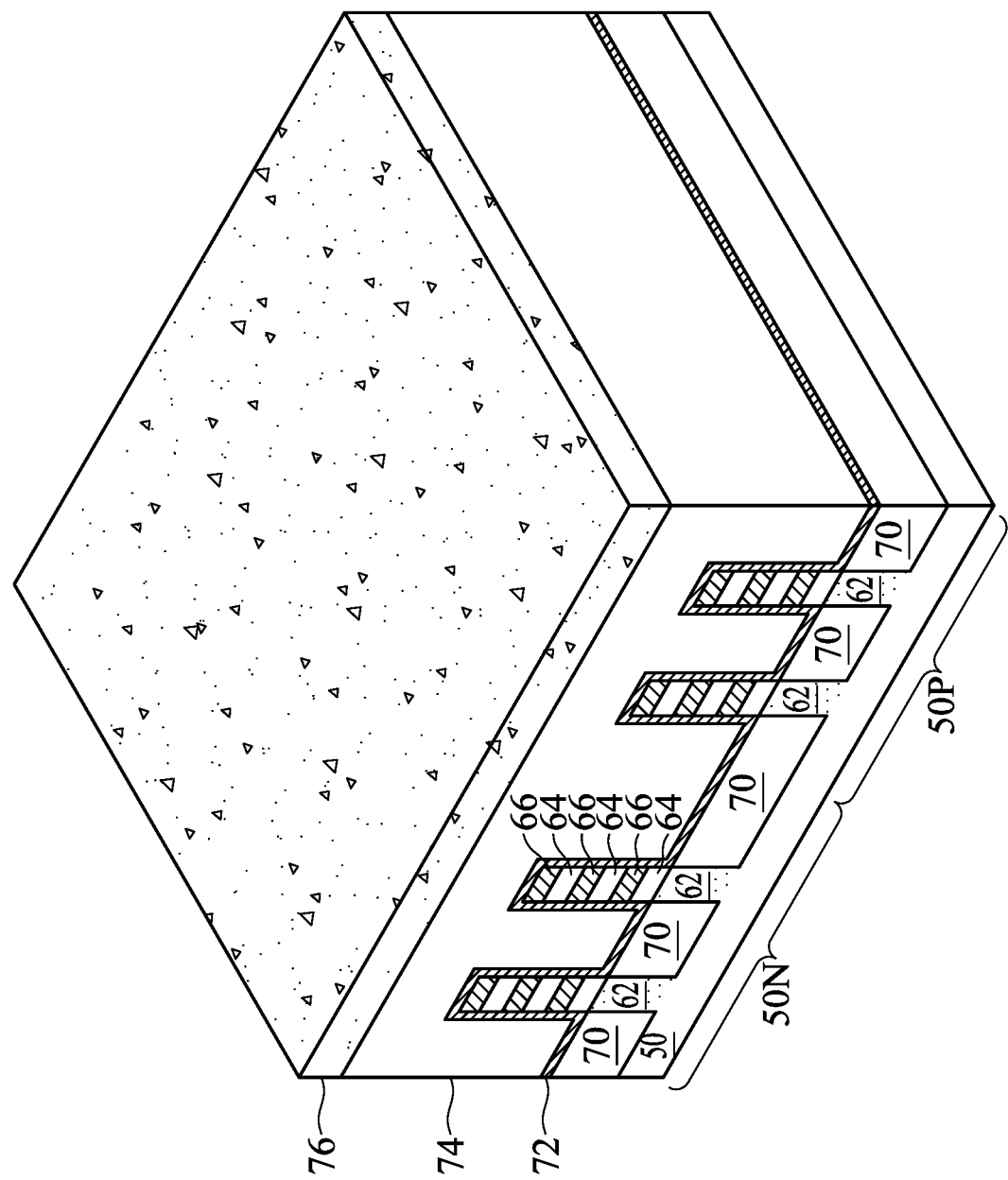

In FIG. 5, a dummy dielectric layer 72 is formed on the fins 62 and the nanostructures 64, 66. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the fins 62, the nanostructures 64, 66, and the STI regions 70, such that the dummy dielectric layer 72 extends over the STI regions 70 and between the dummy gate layer 74 and the STI regions 70. In another embodiment, the dummy dielectric layer 72 covers only the fins 62 and the nanostructures 64, 66.

Figure 6:
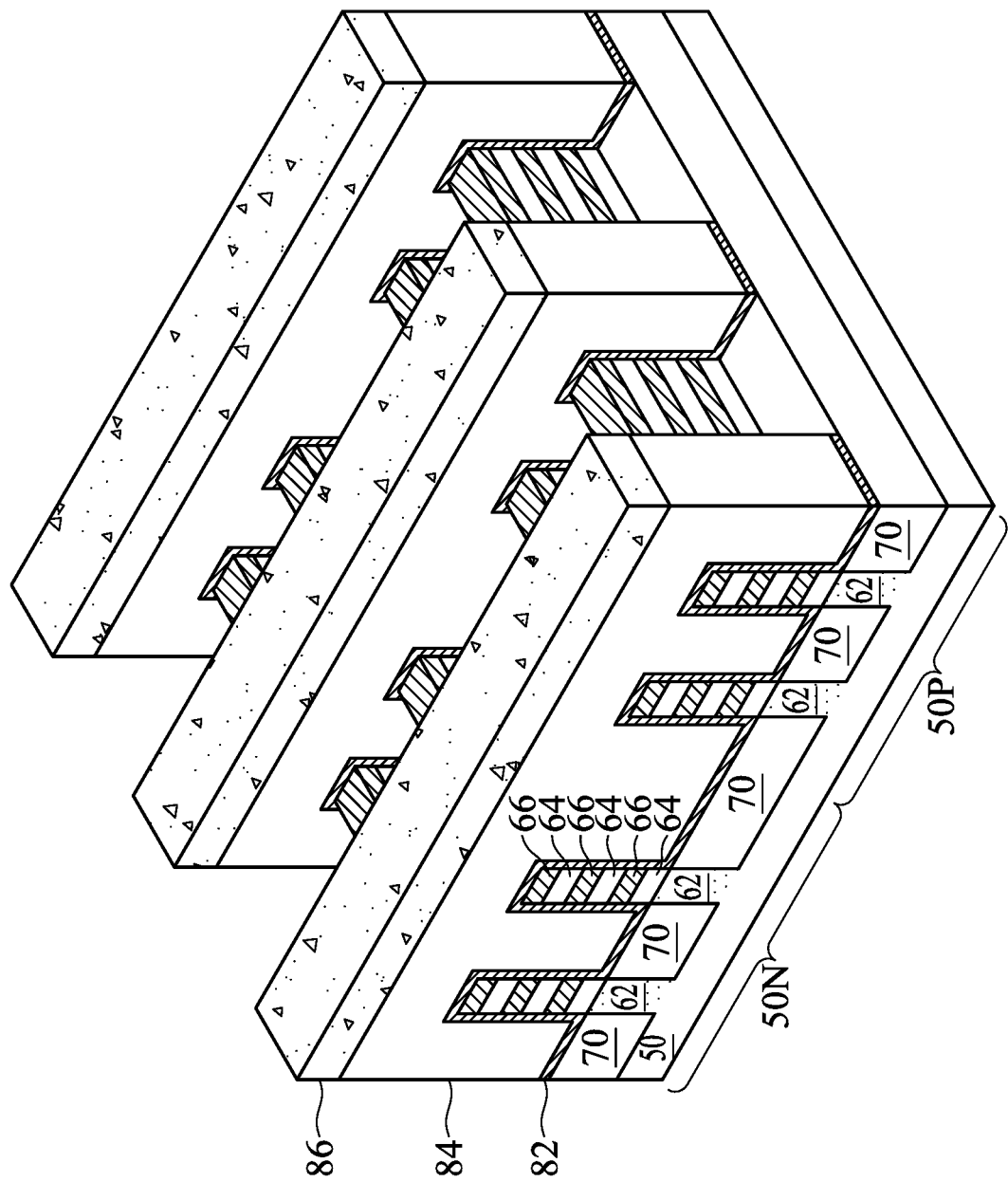

In FIG. 6, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover portions of the nanostructures 64, 66 that will be exposed in subsequent processing to form channel regions. Specifically, the dummy gates 84 extend along the portions of the nanostructures 66 that will be patterned to form channel regions 68. The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after patterning, such as by any acceptable etching technique.

FIGS. 7A through 22B illustrate various additional steps in the manufacturing of embodiment devices. FIGS. 7A through 13B and FIGS. 21A through 22B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure. FIGS. 14A, 15A, 16A, 17A, 18A, 19A, and 20A illustrate features in the n-type region 50N. FIGS. 14B, 15B, 16B, 17B, 18B, 19B, and 20B illustrate features in the p-type region 50P.

Figure 7B:
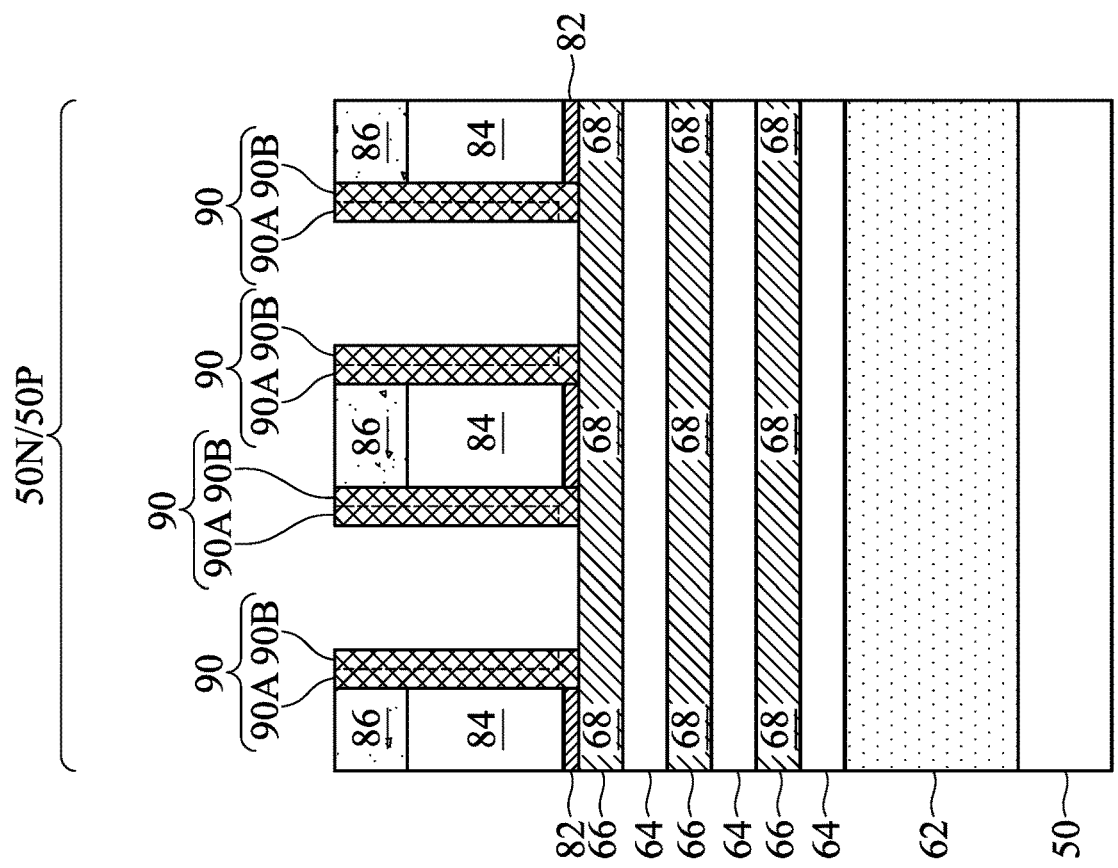
Figure 7A:
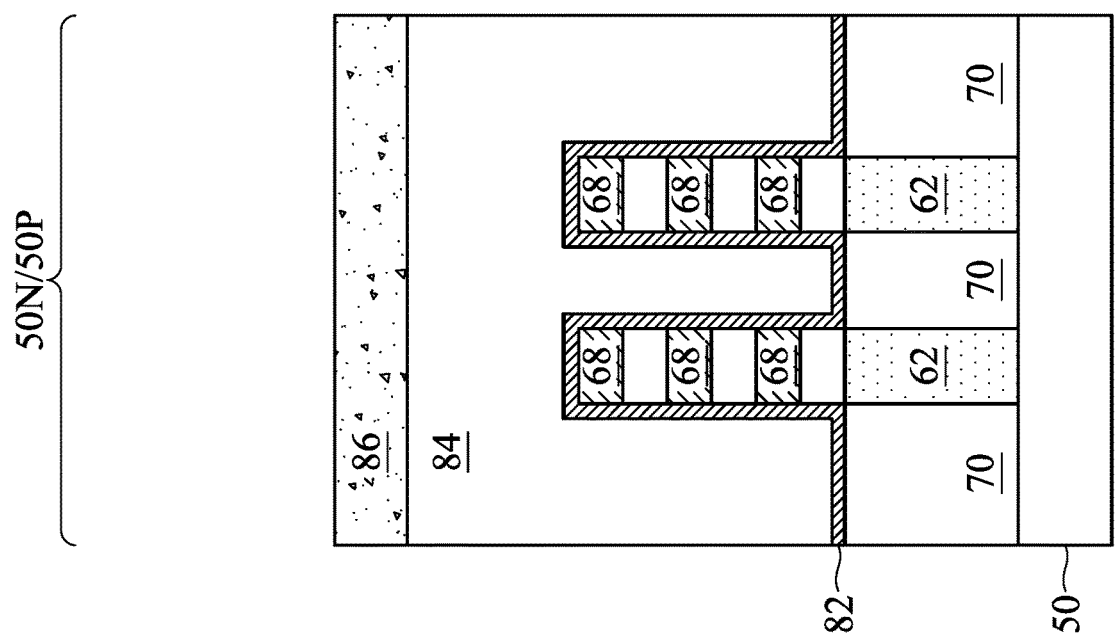

In FIGS. 7A and 7B, gate spacers 90 are formed over the nanostructures 64, 66, on exposed sidewalls of the masks 86 (if present), the dummy gates 84, and the dummy dielectrics 82. The gate spacers 90 may be formed by conformally depositing one or more dielectric material(s) and subsequently etching the dielectric material(s). Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like; multilayers thereof; or the like. The dielectric materials may be formed by a conformal deposition process such as chemical vapor deposition (CVD), plasma enhanced chemical vapor deposition (PECVD), atomic layer deposition (ALD), or the like. In the illustrated embodiment, the gate spacers 90 each include multiple layers, e.g., a first spacer layer 90A and a second spacer layer 90B. In some embodiments, the first spacer layers 90A and the second spacer layers 90B are formed of silicon oxycarbonitride (e.g., $SiO_xN_yC_{1-x-y}$, where x and y are in the range of 0 to 1). For example, the first spacer layers 90A can be formed of a similar or a different composition of silicon oxycarbonitride than the second spacer layers 90B. An acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). After etching, the gate spacers 90 can have straight sidewalls (as illustrated) or can have curved sidewalls (not illustrated). As will be subsequently described in greater detail, the dielectric material(s), when etched, may have portions left on the sidewalls of the fins 62 and/or the nanostructures 64, 66 (thus forming fin spacers).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 8B:
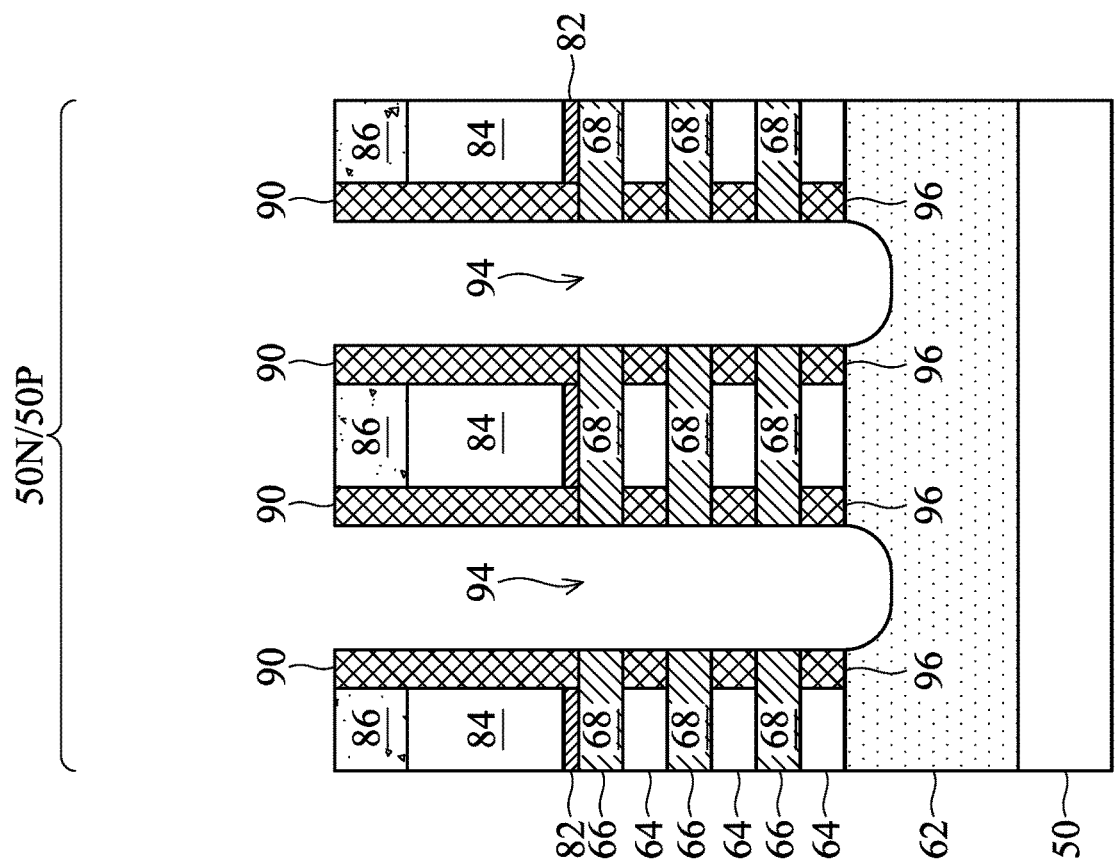
Figure 8A:
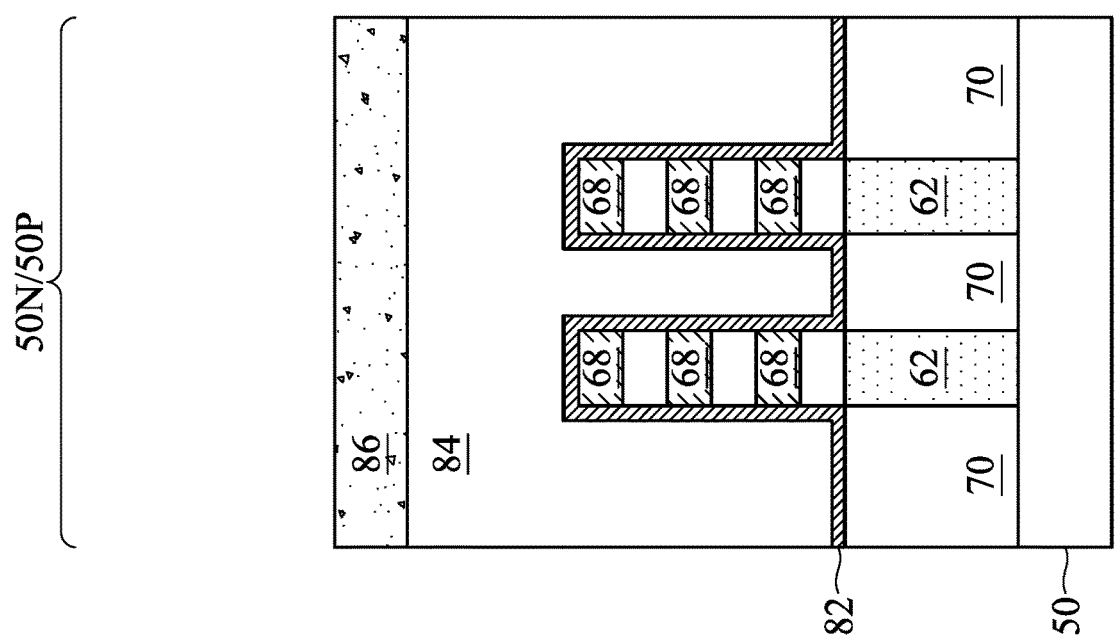

In FIGS. 8A and 8B, source/drain recesses 94 are formed in the nanostructures 64, 66. In the illustrated embodiment, the source/drain recesses 94 extend through the nanostructures 64, 66 and into the fins 62. The source/drain recesses 94 may also extend into the substrate 50. In various embodiments, the source/drain recesses 94 may extend to a top surface of the substrate 50 without etching the substrate 50; the fins 62 may be etched such that bottom surfaces of the source/drain recesses 94 are disposed below the top surfaces of the STI regions 70; or the like. The source/drain recesses 94 may be formed by etching the nanostructures 64, 66 using an anisotropic etching process, such as a RIE, a NBE, or the like. The gate spacers 90 and the dummy gates 84 collectively mask portions of the fins 62 and/or the nanostructures 64, 66 during the etching processes used to form the source/drain recesses 94. A single etch process may be used to etch each of the nanostructures 64, 66, or multiple etch processes may be used to etch the nanostructures 64, 66. Timed etch processes may be used to stop the etching of the source/drain recesses 94 after the source/drain recesses 94 reach a desired depth.

Optionally, inner spacers 96 are formed on the sidewalls of the remaining portions of the first nanostructures 64, e.g., those sidewalls exposed by the source/drain recesses 94. As will be subsequently described in greater detail, source/drain regions will be subsequently formed in the source/drain recesses 94, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etching processes, such as etching processes used to subsequently remove the first nanostructures 64.

As an example to form the inner spacers 96, the source/drain recesses 94 can be laterally expanded. Specifically, portions of the sidewalls of the first nanostructures 64 exposed by the source/drain recesses 94 may be recessed. Although sidewalls of the first nanostructures 64 are illustrated as being straight, the sidewalls may be concave or convex. The sidewalls may be recessed by any acceptable etching process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first nanostructures 64. The inner spacers 96 can then be formed by conformally forming an insulating material and subsequently etching the insulating material. The insulating material may be silicon nitride or silicon oxynitride, although any suitable material, such as low-dielectric constant (low-k) materials having a k-value less than 3.5, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 96 are illustrated as being flush with respect to the sidewalls of the gate spacers 90, the outer sidewalls of the inner spacers 96 may extend beyond or be recessed from the sidewalls of the gate spacers 90. In other words, the inner spacers 96 may partially fill, completely fill, or overfill the sidewall recesses.

Moreover, although the sidewalls of the inner spacers 96 are illustrated as being straight, the sidewalls of the inner spacers 96 may be concave or convex.

Figure 9B:
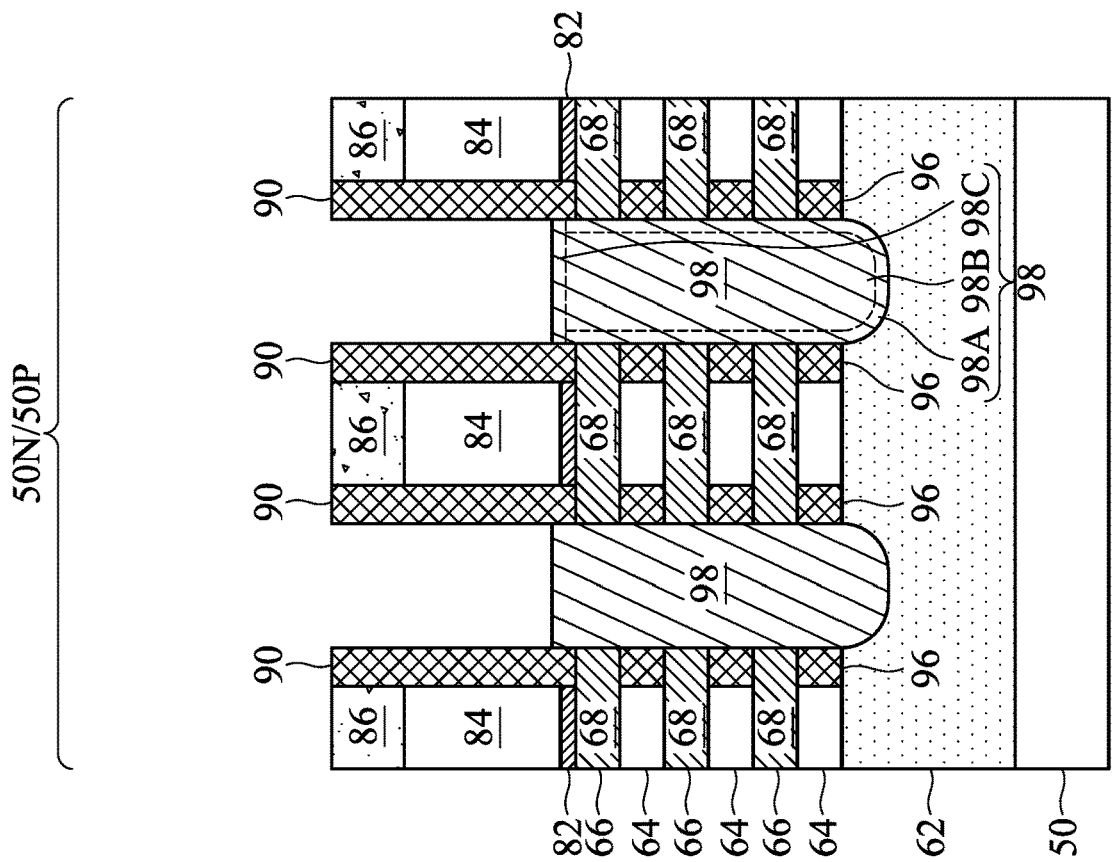
Figure 9A:
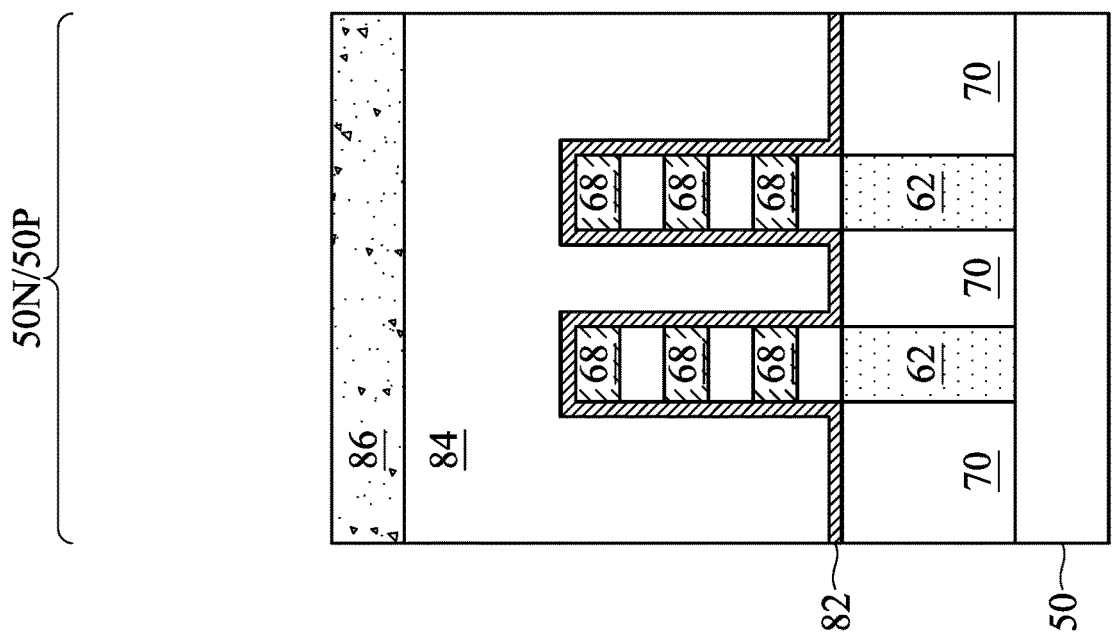
Figure 9D:
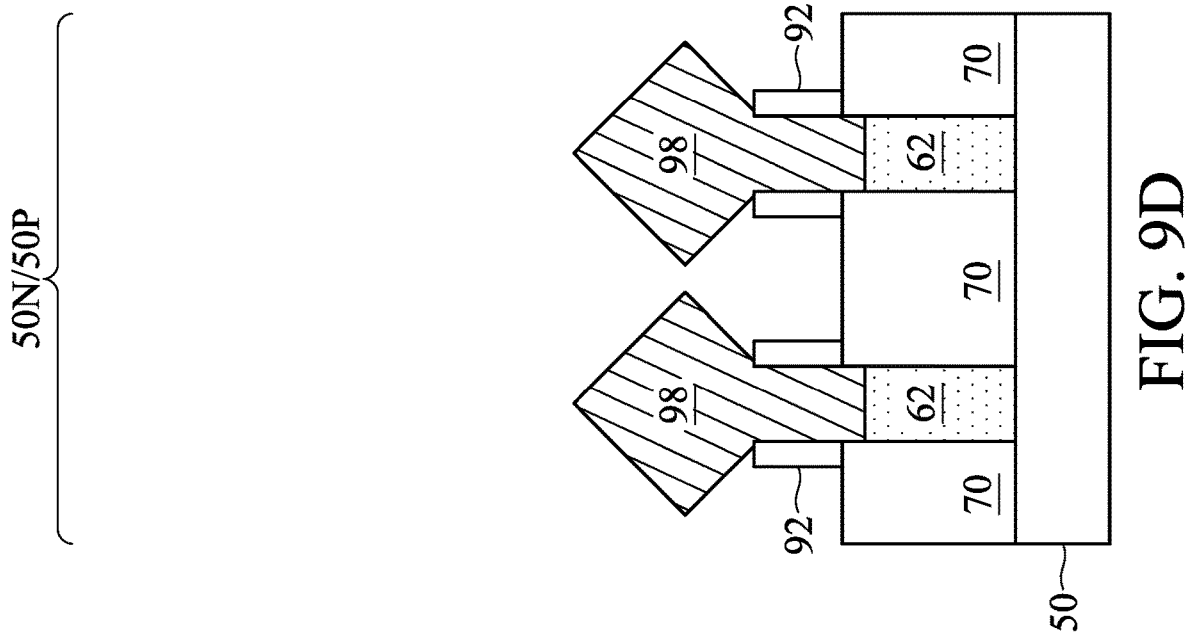
Figure 9C:
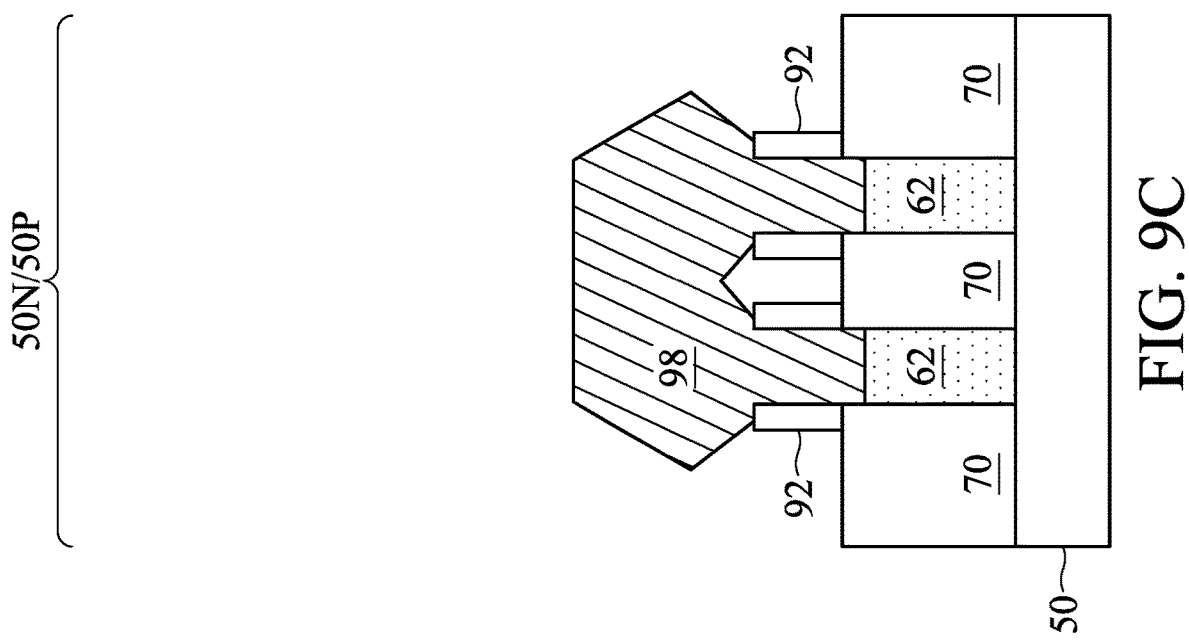

In FIGS. 9A and 9B, epitaxial source/drain regions 98 are formed in the source/drain recesses 94. The epitaxial source/drain regions 98 are formed in the source/drain recesses 94 such that each dummy gate 84 (and corresponding channel regions 68) is disposed between respective adjacent pairs of the epitaxial source/drain regions 98. In some embodiments, the gate spacers 90 and the inner spacers 96 are used to separate the epitaxial source/drain regions 98 from, respectively, the dummy gates 84 and the first nanostructures 64 by an appropriate lateral distance so that the epitaxial source/drain regions 98 do not short out with subsequently formed gates of the resulting nano-FETs. A material of the epitaxial source/drain regions 98 may be selected to exert stress in the respective channel regions 68, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 94 in the n-type region 50N. The epitaxial source/drain regions 98 may include any acceptable material appropriate for n-type devices. For example, the epitaxial source/drain regions 98 in the n-type region 50N may include materials exerting a tensile strain on the channel regions 68, such as silicon, silicon carbide, phosphorous doped silicon carbide, silicon phosphide, or the like. The epitaxial source/drain regions 98 in the n-type region 50N may have surfaces raised from respective surfaces of the fins 62 and the nanostructures 64, 66, and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 94 in the p-type region 50P. The epitaxial source/drain regions 98 may include any acceptable material appropriate for p-type devices. For example, the epitaxial source/drain regions 98 in the p-type region 50P may include materials exerting a compressive strain on the channel regions 68, such as silicon germanium, boron doped silicon germanium, germanium, germanium tin, or the like. The epitaxial source/drain regions 98 in the p-type region 50P may have surfaces raised from respective surfaces of the fins 62 and the nanostructures 64, 66, and may have facets.

The epitaxial source/drain regions 98, the nanostructures 64, 66, and/or the fins 62 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 98 may be in situ doped during growth.

As a result of the epitaxy processes used to form the epitaxial source/drain regions 98, upper surfaces of the epitaxial source/drain regions have facets which expand laterally outward beyond sidewalls of the fins 62 and the nanostructures 64, 66. In some embodiments, these facets cause adjacent epitaxial source/drain regions 98 to merge as illustrated by FIG. 9C. In some embodiments, adjacent epitaxial source/drain regions 98 remain separated after the epitaxy process is completed as illustrated by FIG. 9D. In the illustrated embodiments, the spacer etch used to form the gate spacers 90 is adjusted to also form fin spacers 92 on sidewalls of the fins 62 and/or the nanostructures 64, 66. The fin spacers 92 are formed to cover a portion of the sidewalls of the fins 62 and/or the nanostructures 64, 66 that extend above the STI regions 70, thereby blocking the epitaxial growth. In another embodiment, the spacer etch used to form the gate spacers 90 is adjusted to not form fin spacers, so as to allow the epitaxial source/drain regions 98 to extend to the surface of the STI regions 70.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. Each of the liner layer 98A, the main layer 98B, and the finishing layer 98C may be formed of different semiconductor materials and may be doped to different impurity concentrations. In some embodiments, the liner layer 98A may have a lesser concentration of impurities than the main layer 98B, and the finishing layer 98C may have a greater concentration of impurities than the liner layer 98A and a lesser concentration of impurities than the main layer 98B. In embodiments in which the epitaxial source/drain regions 98 include three semiconductor material layers, the liner layers 98A may be grown in the source/drain recesses 94, the main layers 98B may be grown on the liner layers 98A, and the finishing layers 98C may be grown on the main layers 98B.

Figure 10B:
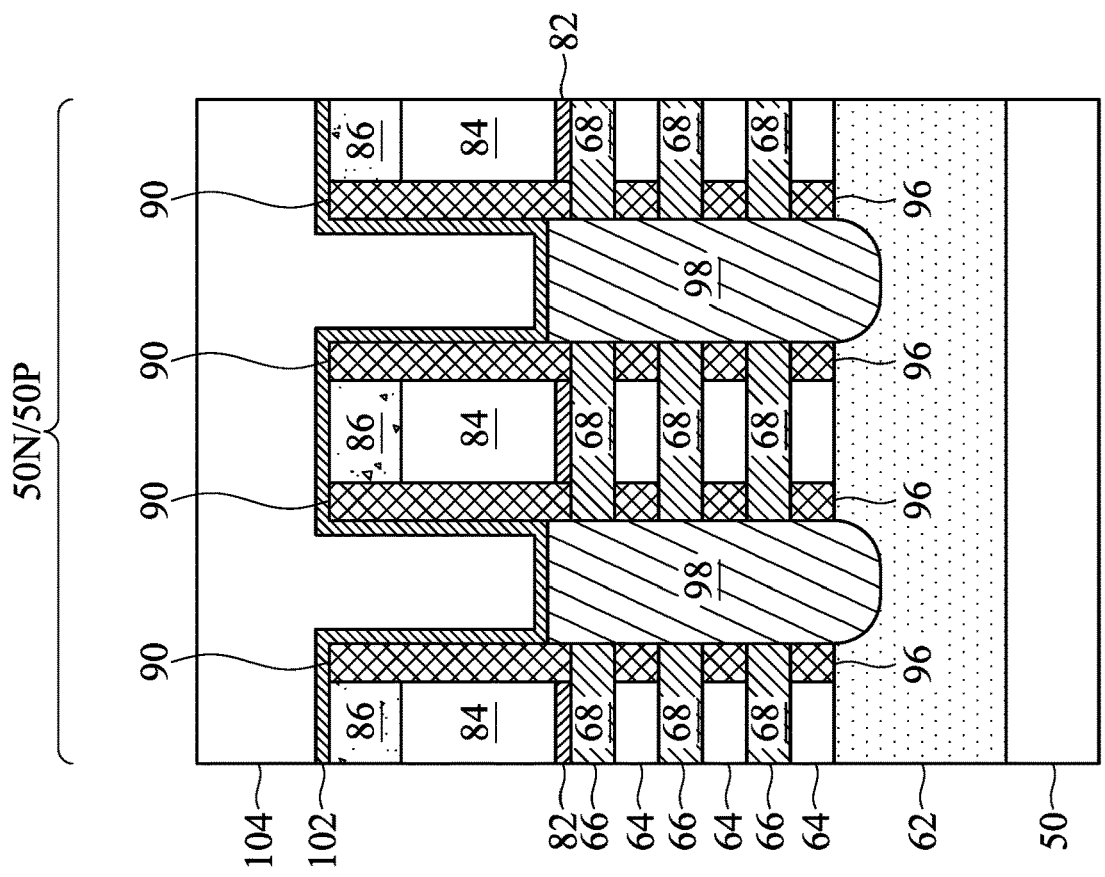
Figure 10A:
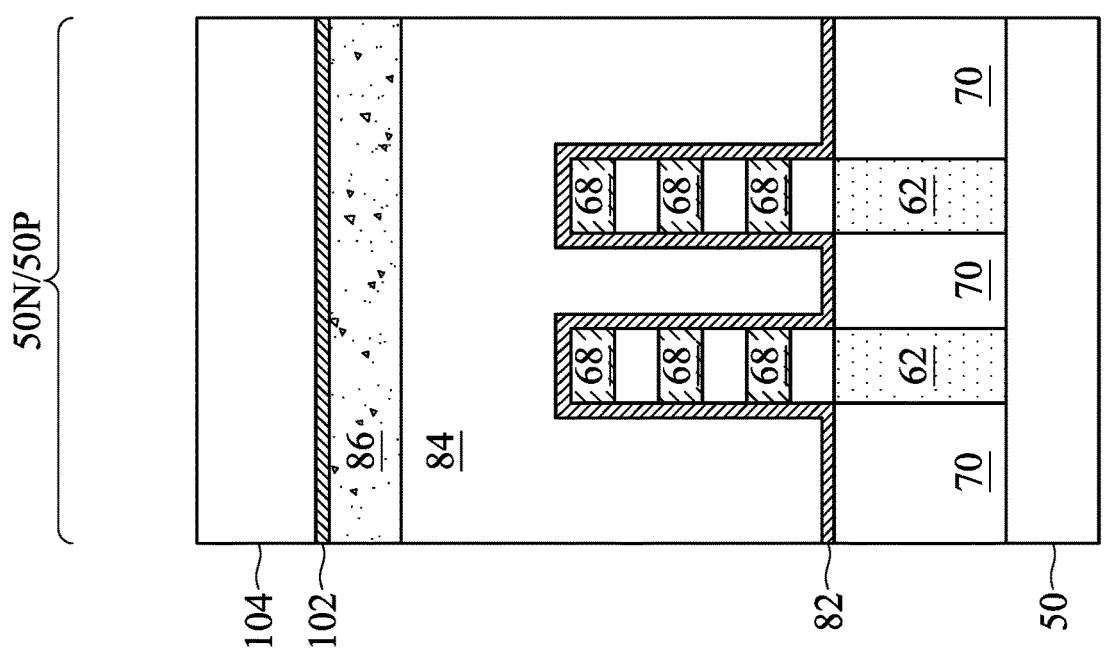

In FIGS. 10A and 10B, a first inter-layer dielectric (ILD) 104 is deposited over the epitaxial source/drain regions 98, the gate spacers 90, the masks 86 (if present) or the dummy gates 84. The first ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 90, and the masks 86 (if present) or the dummy gates 84. The CESL 102 may be formed of a dielectric material, such as silicon nitride, silicon oxide, silicon oxynitride, or the like, having a high etching selectivity from the etching of the first ILD 104. The CESL 102 may be formed by any suitable method, such as CVD, ALD, or the like.

Figure 11B:
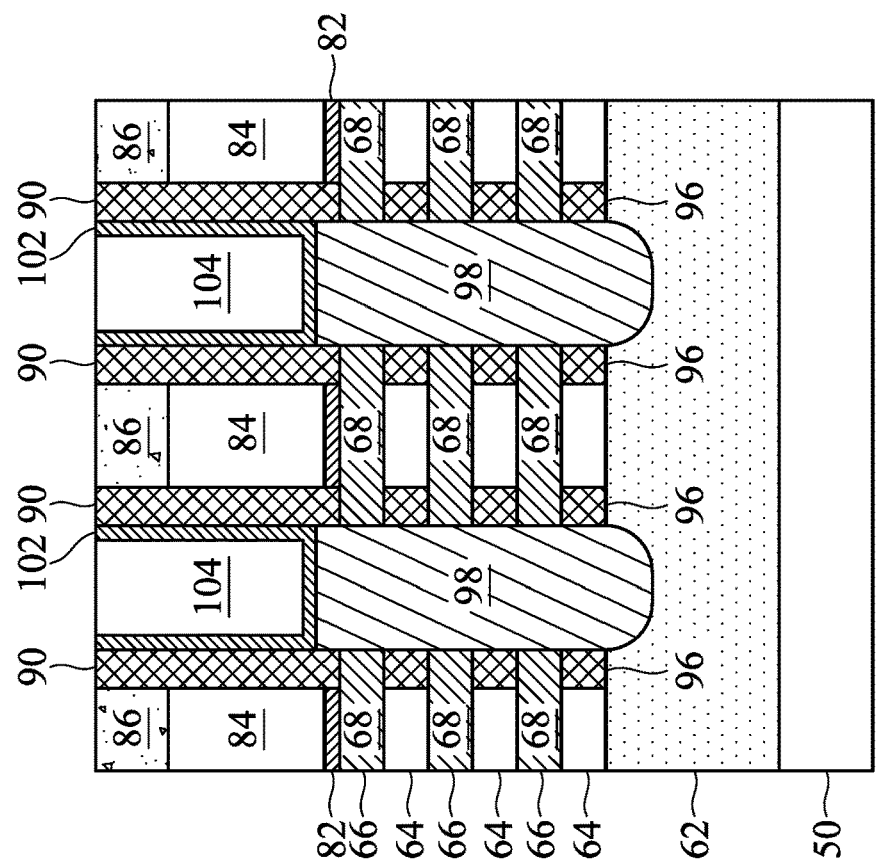
Figure 11A:
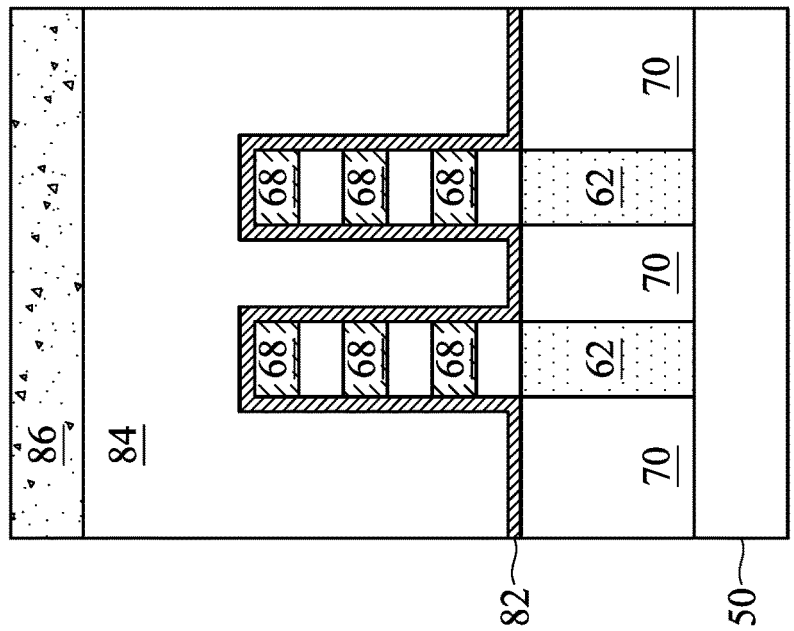

In FIGS. 11A and 11B, a removal process is performed to level the top surfaces of the first ILD 104 with the top surfaces of the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, the top surfaces of the gate spacers 90, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 12B:
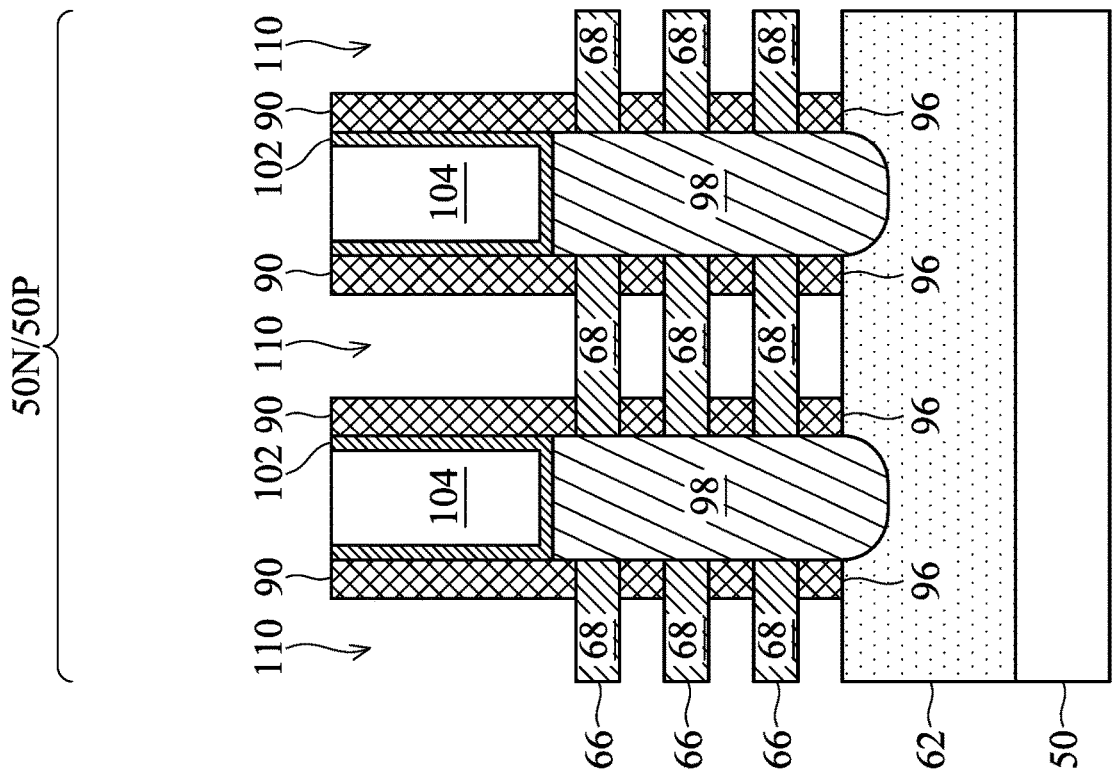
Figure 12A:
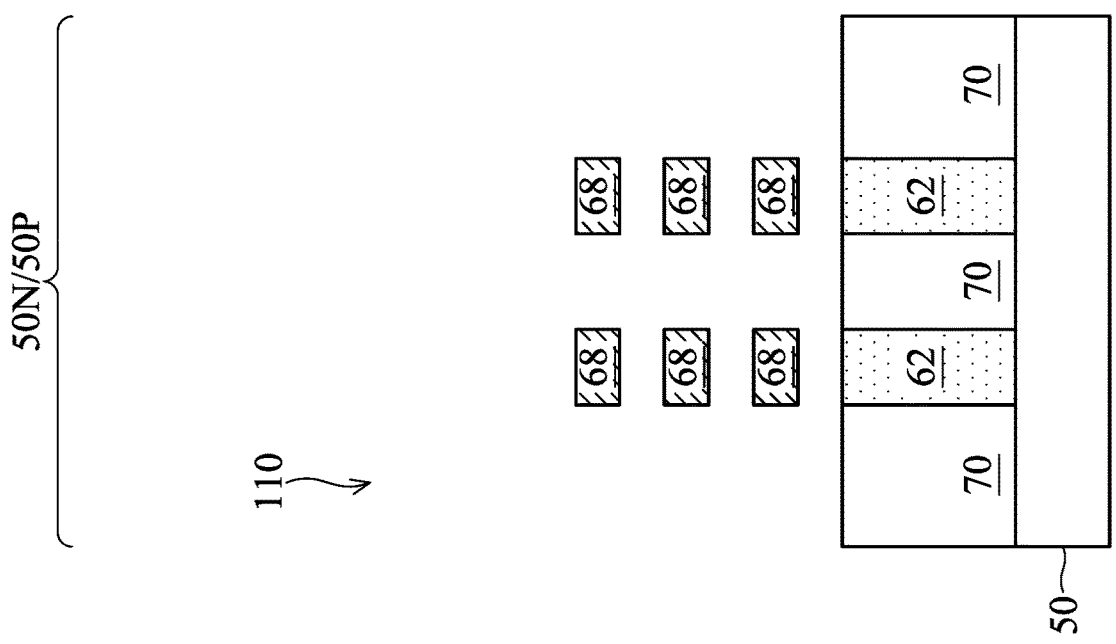

In FIGS. 12A and 12B, the masks 86 (if present) and the dummy gates 84 are removed in an etching process, so that recesses 110 are formed. Portions of the dummy dielectrics 82 in the recesses 110 are also removed. In some embodiments, the dummy gates 84 are removed by an anisotropic dry etch process. For example, the etching process may include a dry etch process using reaction gas(es) that selectively etch the dummy gates 84 at a faster rate than the first ILD 104 or the gate spacers 90. During the removal, the dummy dielectrics 82 may be used as etch stop layers when the dummy gates 84 are etched. The dummy dielectrics 82 are then removed. Each recess 110 exposes and/or overlies portions of the channel regions 68. Portions of the second nanostructures 66 which act as the channel regions 68 are disposed between adjacent pairs of the epitaxial source/drain regions 98.

The remaining portions of the first nanostructures 64 are then removed to expand the recesses 110. The remaining portions of the first nanostructures 64 can be removed by any acceptable etching process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etching process may be a wet etch using tetramethylammonium hydroxide (TMAH), $NH_4OH$, $H_2O_2$, $H_2O$, HF, $C_3H_8O_2$, $C_2H_4C_3$, the like, or combinations thereof. In some embodiments, a trim process (not separately illustrated) is performed to decrease the thicknesses of the exposed portions of the second nanostructures 66. As illustrated more clearly in FIGS. 14A through 20B (subsequently described in greater detail), the remaining portions of the second nanostructures 66 can have rounded corners.

Figure 13B:
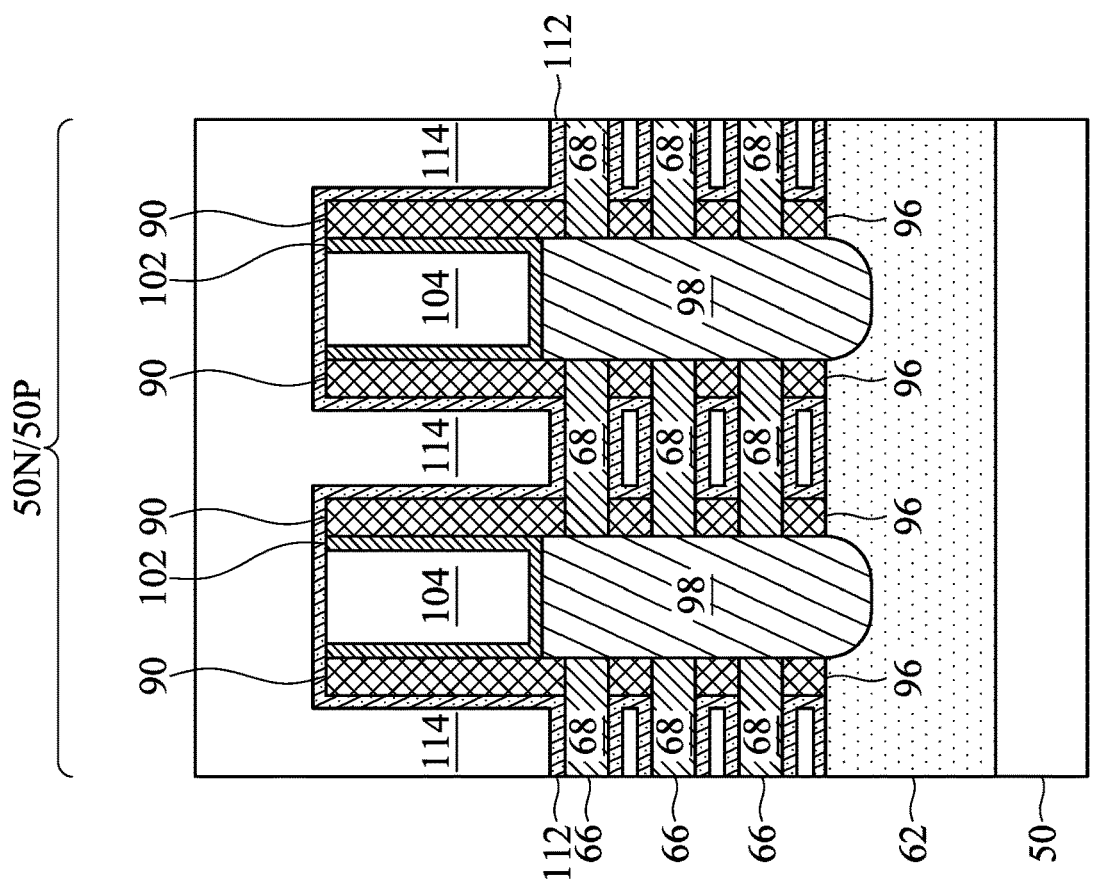
Figure 13A:
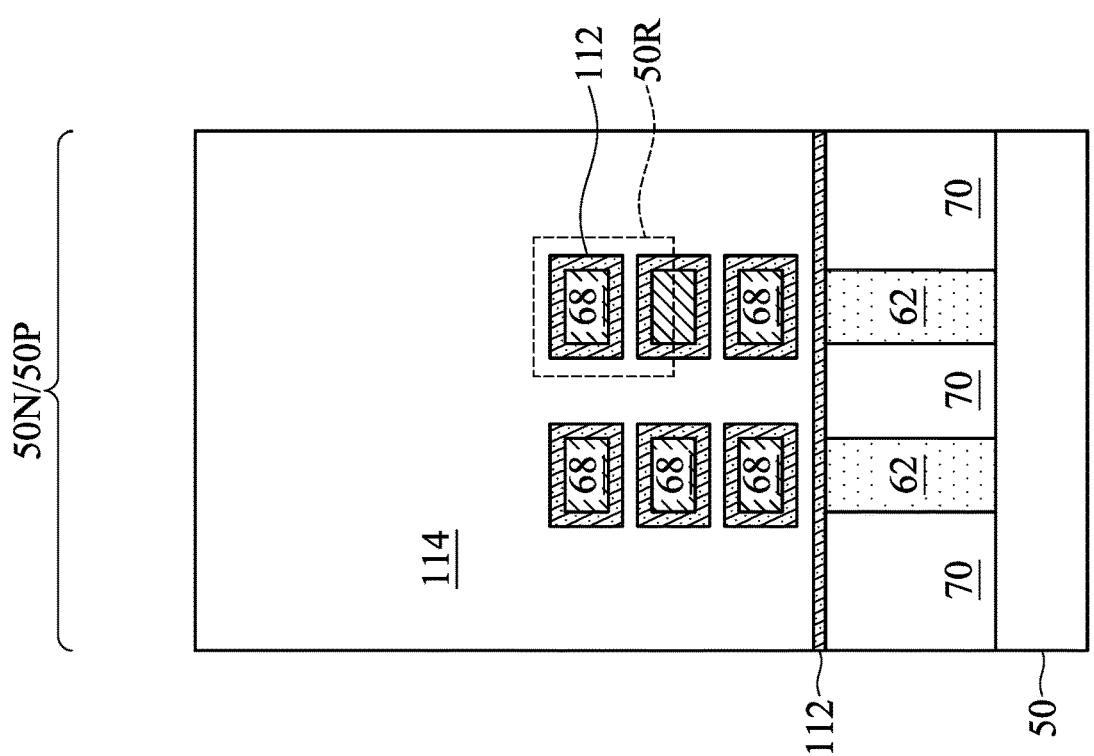

In FIGS. 13A and 13B, a gate dielectric layer 112 is formed in the recesses 110. A gate electrode layer 114 is formed on the gate dielectric layer 112. The gate dielectric layer 112 and the gate electrode layer 114 are layers for replacement gates, and each wrap around all (e.g., four) sides of the second nanostructures 66.

The gate dielectric layer 112 is disposed on the sidewalls and/or the top surfaces of the fins 62; on the top surfaces, the sidewalls, and the bottom surfaces of the second nanostructures 66; and on the sidewalls of the gate spacers 90. The gate dielectric layer 112 may also be formed on the top surfaces of the first ILD 104 and the gate spacers 90. The gate dielectric layer 112 may include an oxide such as silicon oxide or a metal oxide, a silicate such as a metal silicate, combinations thereof, multi-layers thereof, or the like. The gate dielectric layer 112 may include a dielectric material having a k-value greater than 7.0, such as a metal oxide or a silicate of hafnium, aluminum, zirconium, lanthanum, manganese, barium, titanium, lead, and combinations thereof. Although a single layered gate dielectric layer 112 is illustrated in FIGS. 13A and 13B, as will be subsequently described in greater detail, the gate dielectric layer 112 may include an interfacial layer and a main layer.

The gate electrode layer 114 may include a metal-containing material such as titanium nitride, titanium oxide, tantalum nitride, tantalum carbide, cobalt, ruthenium, aluminum, tungsten, combinations thereof, multi-layers thereof, or the like. Although a single-layered gate electrode layer 114 is illustrated in FIGS. 13A and 13B, as will be subsequently described in greater detail, the gate electrode layer 114 may include any number of work function tuning layers, any number of barrier layers, any number of glue layers, and a fill material.

Figure 28:
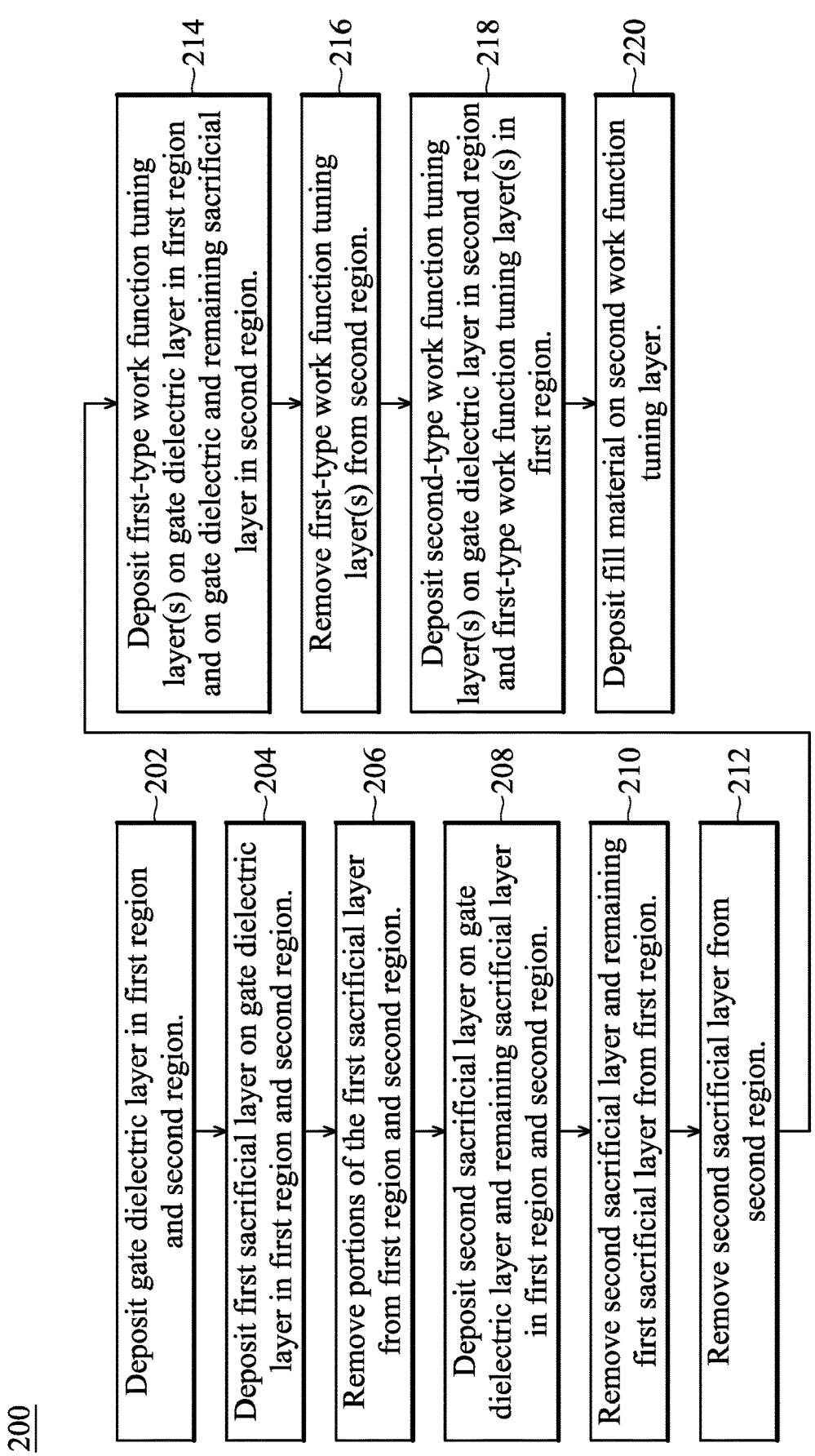
FIG. 28 is a flow chart of an example method for forming replacement gates for nano-FETs, in accordance with some embodiments.

FIGS. 14A through 24B illustrate a process in which layers for replacement gates are formed in the recesses 110. Features in regions that are similar to a region 50R in FIG. 13A are illustrated. FIG. 28 is a flow chart of an example method 200 for forming the replacement gate layers, in accordance with some embodiments. FIGS. 14A through 24B are described in conjunction with FIG. 28.

Figure 14B:
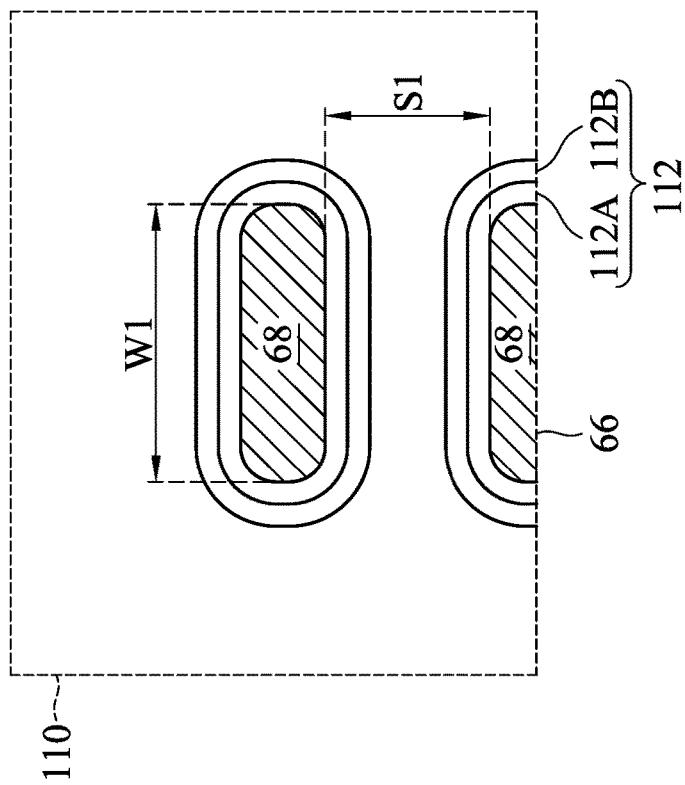
Figure 14A:
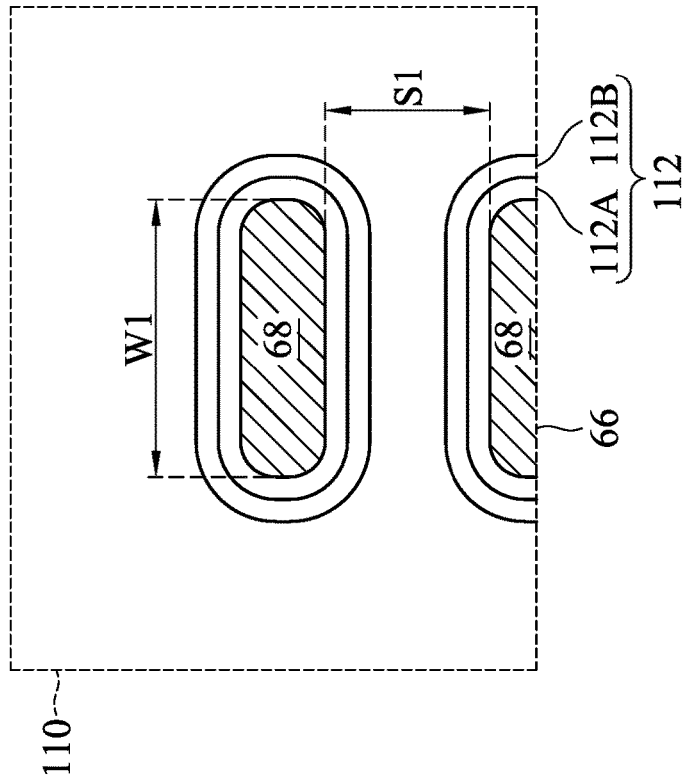

In FIGS. 14A and 14B and step 202 of the method 200, the gate dielectric layer 112 is deposited in the recesses 110 in both the first region (e.g., the n-type region 50N) and the second region (e.g., the p-type region 50P). The gate dielectric layer 112 may also be deposited on the top surfaces of the first ILD 104 and the gate spacers 90 (see FIG. 13B). In the illustrated embodiment, the gate dielectric layer 112 is multilayered, including an interfacial layer 112A (or more generally, a first gate dielectric layer) and an overlying high-k dielectric layer 112B (or more generally, a second gate dielectric layer). The interfacial layer 112A may be formed of silicon oxide or the like and the high-k dielectric layer 112B may be formed of hafnium oxide, lanthanum oxide, or the like. The formation methods of the gate dielectric layer 112 may include molecular-beam deposition (MBD), ALD, PECVD, and the like. The gate dielectric layer 112 wraps around all (e.g., four) sides of the second nanostructures 66.

In some embodiments, the second nanostructures 66 have a width W1 in a range from 1 nm to 50 nm, such as a range from 15 nm to 25 nm. In some embodiments, adjacent second nanostructures 66 are spaced apart by a spacing S1 in a range from 0.1 nm to 40 nm, such as a range from 3 nm to 8 nm. If the spacing S1 is higher than 40 nm, a seam or void may be formed between adjacent second nanostructures 66 after the subsequent formation of the gate structures. If the spacing S1 is lower than 0.1 nm, the adjacent second nanostructures 66 could easily short to each other.

Figure 15B:
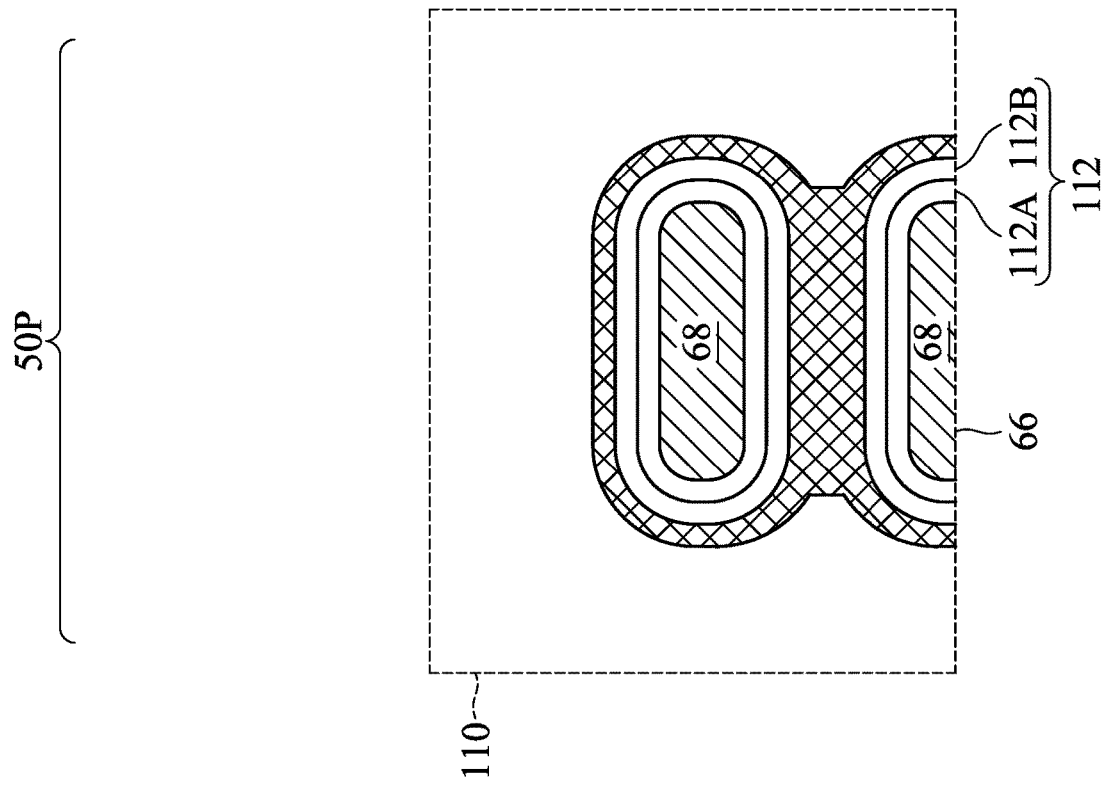
Figure 15A:
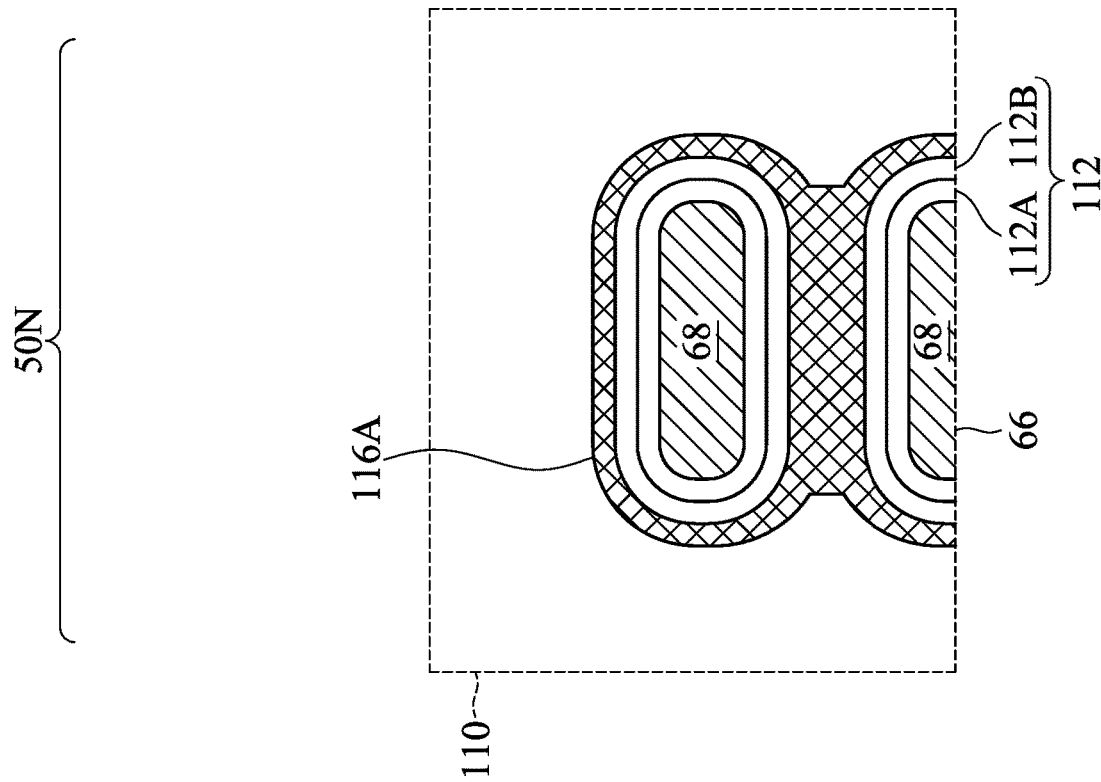

In FIGS. 15A and 15B and step 204 of the method 200, a first sacrificial layer 116A is deposited on the gate dielectric layer 112 in the first region (e.g., the n-type region 50N) and the second region (e.g., the p-type region 50P). As will be subsequently described in greater detail, the first sacrificial layer 116A will be patterned to remove portions of the first sacrificial layer 116A in the first region (e.g., the n-type region 50N) while leaving portions of the first sacrificial layer 116A in the second region (e.g., the p-type region 50P). Specifically, the first sacrificial layer 116A is used to ease the removal of work function layers from the second region (e.g., the p-type region 50P) by not allowing those work function layers to get between the second nanostructures 66. The first sacrificial layer 116A includes any acceptable material that can be formed on and removed from between second nanostructures 66, and may be deposited using any acceptable deposition process. For example, the first sacrificial layer 116A is formed of TiN, WCN, $WCl_5$, $TaCl_5$, $SnCl_4$, combinations thereof, or the like, which may be deposited by ALD, CVD, PVD, or the like. Although the first sacrificial layer 116A is shown as being single layered, the first sacrificial layer 116A can be multilayered. The first sacrificial layer 116A may fill portions of the second recesses 110 extending between vertically adjacent ones of the nanostructures 66 and extending between the nanostructures 66 and the fins 62.

Figure 16B:
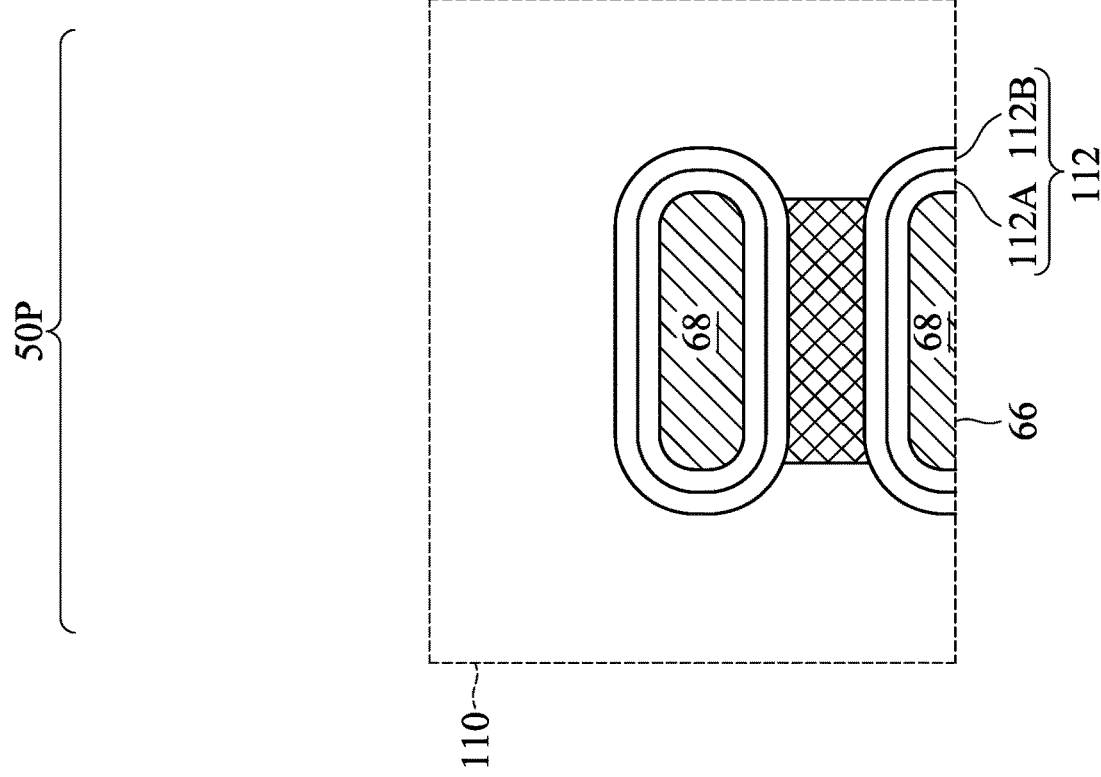
Figure 16A:
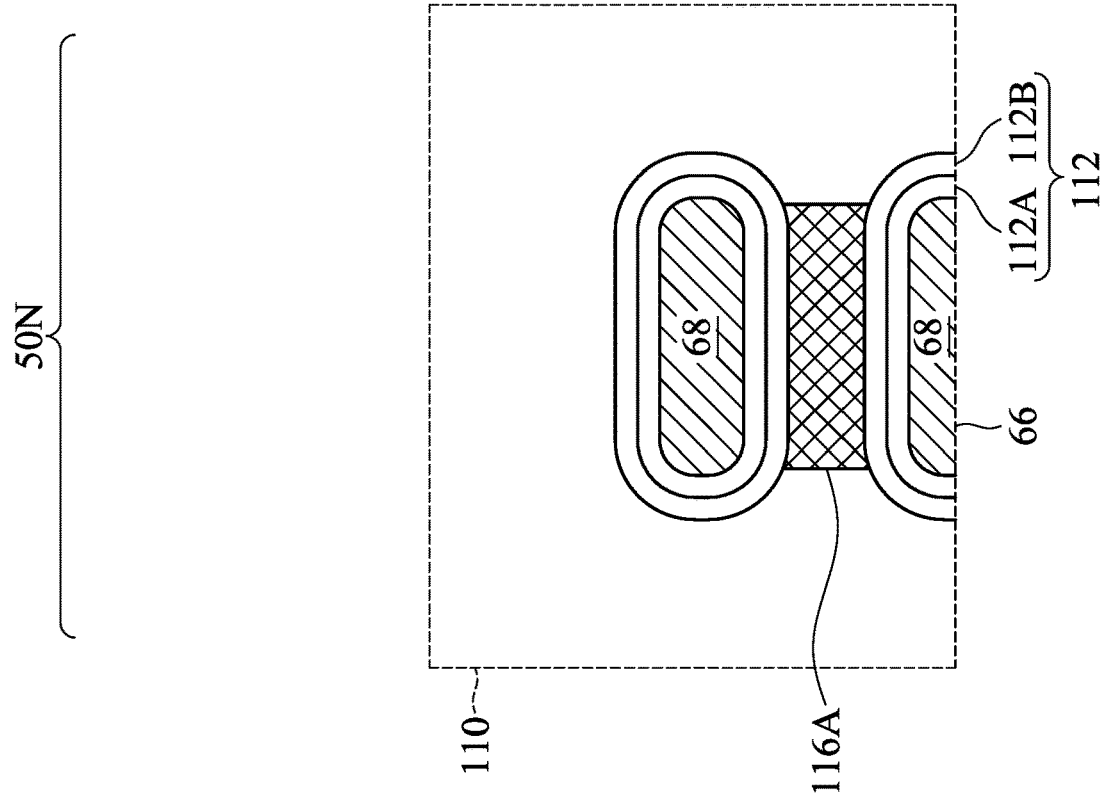

In FIGS. 16A and 16B and step 206 of the method 200, portions of the first sacrificial layer 116A are removed from the first region (e.g., the n-type region 50N) and the second region (e.g., the p-type region 50P). Removing the portions of the first sacrificial layer 116A allows for the subsequent formation of a second sacrificial layer 116B to protect the gate dielectric layer 112 while potentially providing etch selectivity to the first sacrificial layer 116A. The removal may be by acceptable photolithography and etching techniques. The etching may include any acceptable etch process, such as a reactive ion etch (RIE), neutral beam etch (NBE), the like, or a combination thereof. The etching may be anisotropic. As illustrated in FIGS. 16A and 16B, the removal of portions of first sacrificial layer 116A removes outer portions of the first sacrificial layer 116A to expose the gate dielectric layer 112 but leaves the first sacrificial layer 116A between vertically adjacent ones of the nanostructures 66 and extending between the nanostructures 66 and the fins 62 in both the first and second regions 50N and 50P. This removal of outer portions of the first sacrificial layer 116A while leaving inner portions may be referred to as a trimming process.

After the removal of portions of the first sacrificial layer 116A, the gate dielectric layer 112 remains over and covers isolations regions 70 (see, e.g., FIG. 13A). These portions of gate dielectric layer 112 can help to protect the isolation regions 70 from damage from subsequent deposition and removal processes.

In some embodiments, a single etch is performed to remove the portions of the first sacrificial layer 116A. The single etch may be selective to the materials of the first sacrificial layer 116A (e.g., selectively etches the material of the first sacrificial layer 116A at a faster rate than the material(s) of the gate dielectric layer 112). In some embodiments, multiple etch steps/processes are performed to remove the portions of the first sacrificial layer 116A.

Figure 17B:
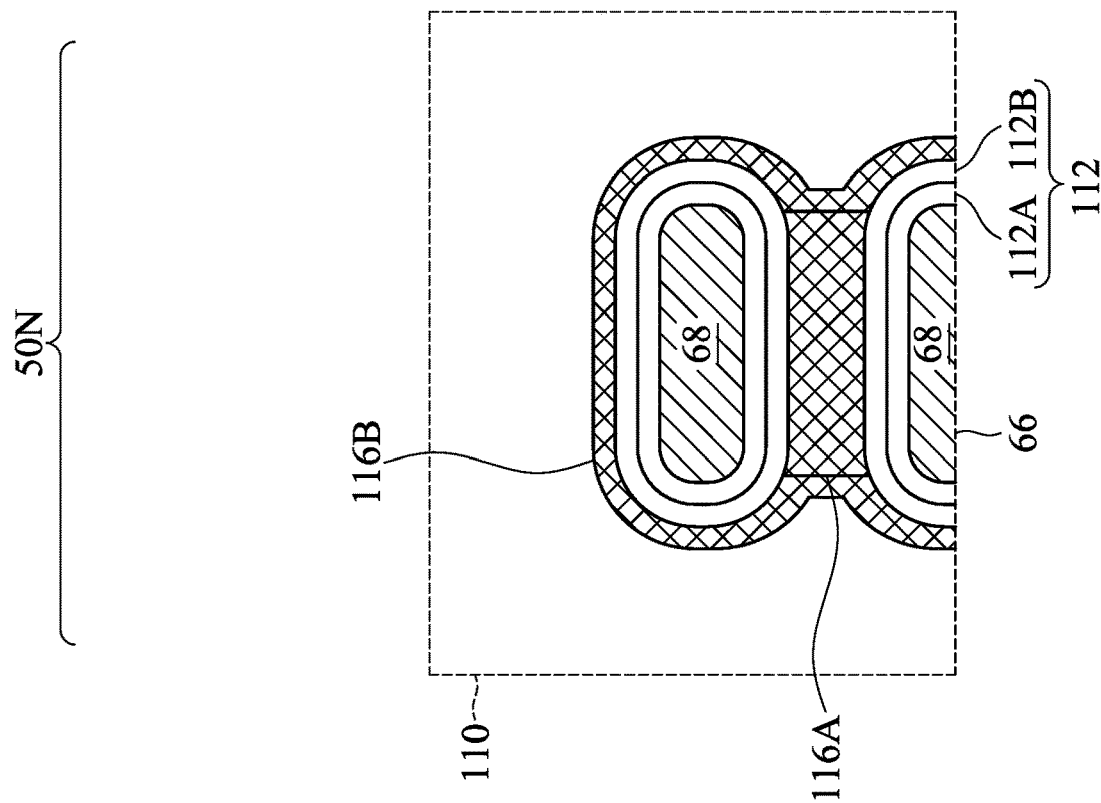
Figure 17A:
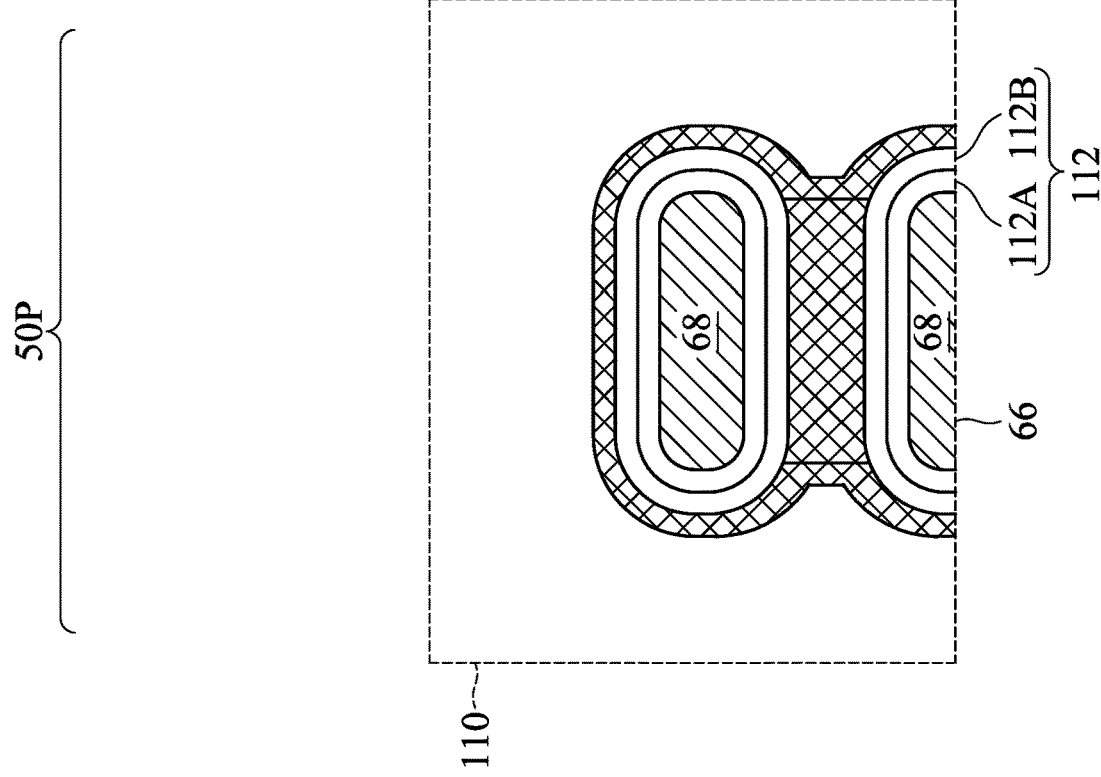

In FIGS. 17A and 17B and step 208 of the method 200, a second sacrificial layer 116A is deposited on the gate dielectric layer 112 and the remaining first sacrificial layer 116A in the first region (e.g., the n-type region 50N) and the second region (e.g., the p-type region 50P). As will be subsequently described in greater detail, the second sacrificial layer 116B will be patterned to remove it and the first sacrificial layer 116A from in the first region (e.g., the n-type region 50N) while leaving the second sacrificial layer 116B and the first sacrificial layer 116A in the second region (e.g., the p-type region 50P). Specifically, the second sacrificial layer 116B is used to protect the gate dielectric layer 112 from first mask layer 118A formed in the first and second regions by not allowing the first mask layer 118A to be formed directly on the gate dielectric layer 112. The second sacrificial layer 116B includes any acceptable material that can be formed on and removed from the gate dielectric layer 112 without damaging the gate dielectric layer 112, and may be deposited using any acceptable deposition process. For example, the second sacrificial layer 116B is formed of TiN, WCN, WCl$_5$, TaCl$_5$, SnCl$_4$, combinations thereof, or the like, which may be deposited by ALD, CVD, PVD, or the like. In some embodiments, the second sacrificial layer 116B is formed of a different material than the first sacrificial layer 116A. Although the second sacrificial layer 116B is shown as being single layered, the second sacrificial layer 116B can be multilayered.

In some embodiments, the second sacrificial layer 116B is formed of a same material as the first sacrificial layer 116A and there is no visible interface between the layers 116A and 116B. In some embodiments, the second sacrificial layer 116B is omitted and the first sacrificial layer 116A is not patterned as illustrated in FIGS. 16A and 16B such that the first sacrificial layer 116A protects the dielectric layer 112 from the first mask layer 118A.

Figure 18B:
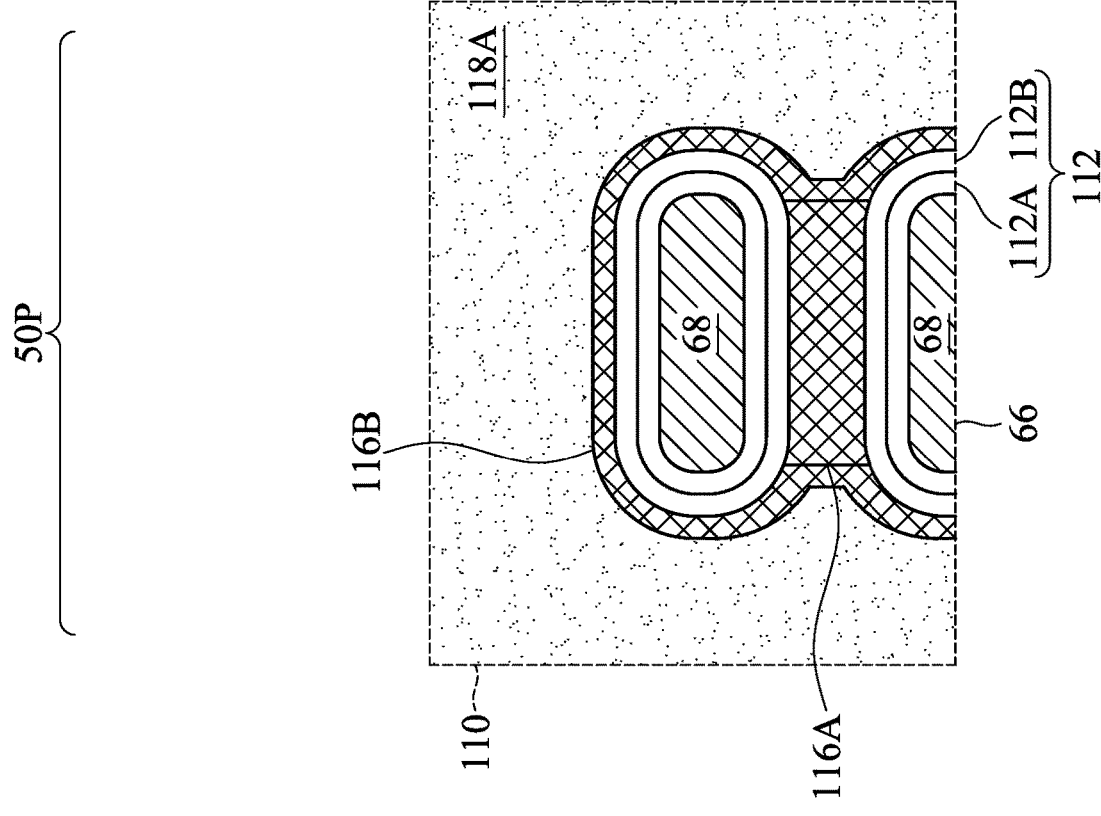
Figure 18A:
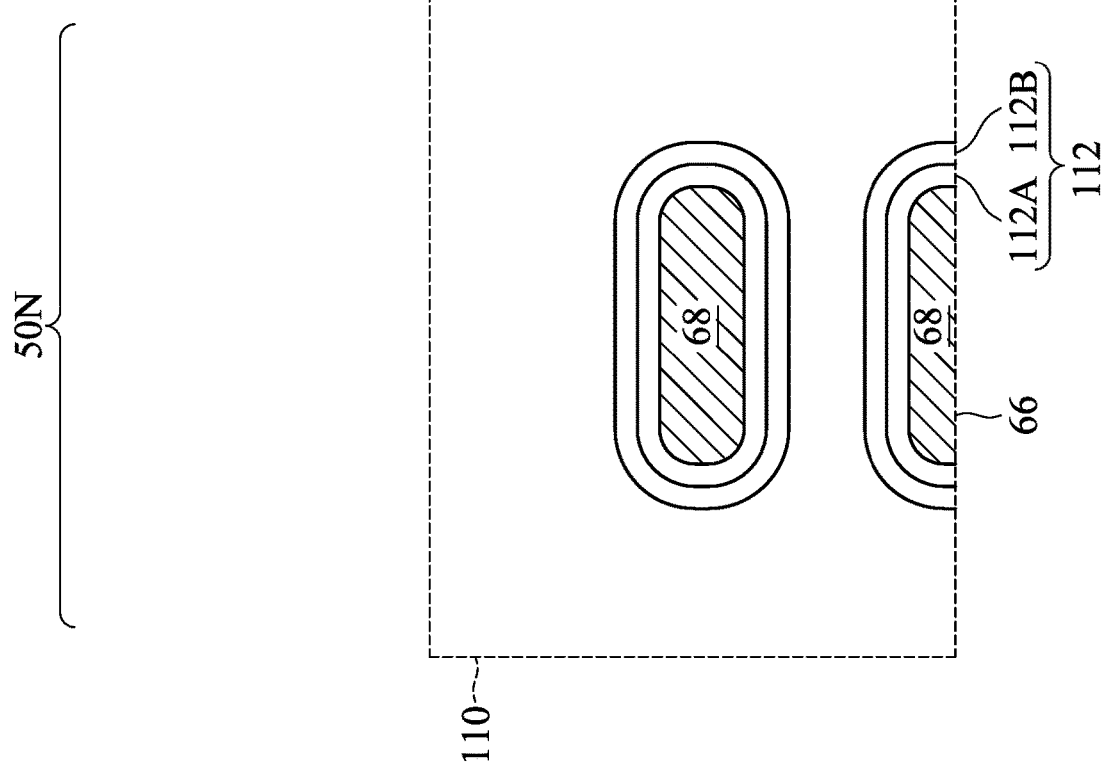

In FIGS. 18A and 18B and step 210 of the method 200, the first mask layer 118A is formed in the second recesses 110 over the second sacrificial layer 116B in the first and second regions 50N and 50P. The first mask layer 118A may be deposited by spin-on-coating or the like. The first mask layer 118A may include a polymer material, such as poly (methyl)acrylate, poly(maleimide), novolacs, poly(ether)s, combinations thereof, or the like. In some embodiments, the first mask layer 118A may be a bottom anti-reflective coating (BARC) material.

As illustrated in FIGS. 18A and 18B, the first mask layer 118A is patterned to remove the first mask layer 118A from the recesses 110 in the first region 50N. The first mask layer 118A may be removed by plasma ashing, an etching process such as an isotropic or an anisotropic etching process, or the like. After patterning the first mask layer 118A, the first and second sacrificial layers 116A and 116B are removed from the first region 50N using the first mask layer 118A as a mask. The removal may be by acceptable photolithography and etching techniques. The etching may include any acceptable etch process, such as a RIE, NBE, a wet etch, the like, or a combination thereof. The etching may be anisotropic.

In some embodiments, a single etch is performed to remove the portions of the first and second sacrificial layers 116A and 116B. The single etch may be selective to the materials of the first and second sacrificial layers 116A and 116B (e.g., selectively etches the materials of the first and second sacrificial layers 116A and 116B at a faster rate than the material(s) of the gate dielectric layer 112). For example, when the first and second sacrificial layers 116A and 116B are formed of titanium nitride, it may be removed by an inductively coupled plasma etching process using Ar/CHF$_3$, Ar/Cl$_2$, Ar/BCl$_3$, the like, or a combination thereof. In some embodiments, multiple etch steps/processes are performed to remove the first and second sacrificial layers 116A and 116B.

Figure 19B:
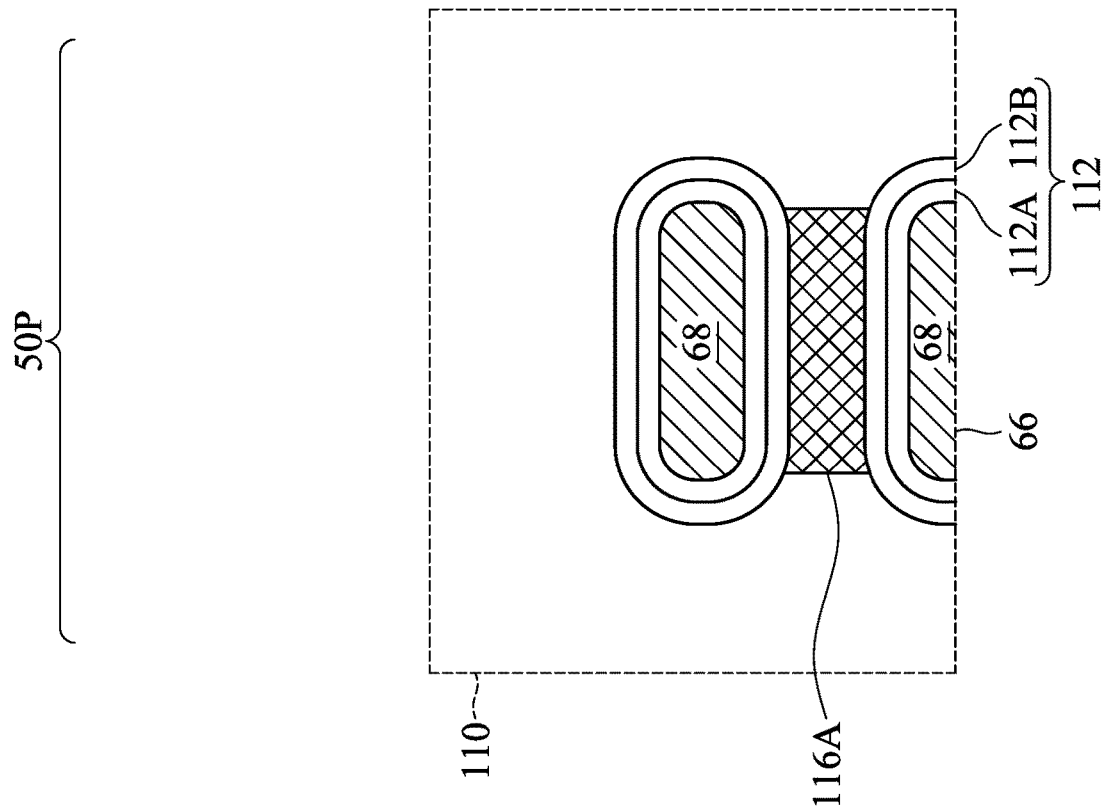
Figure 19A:
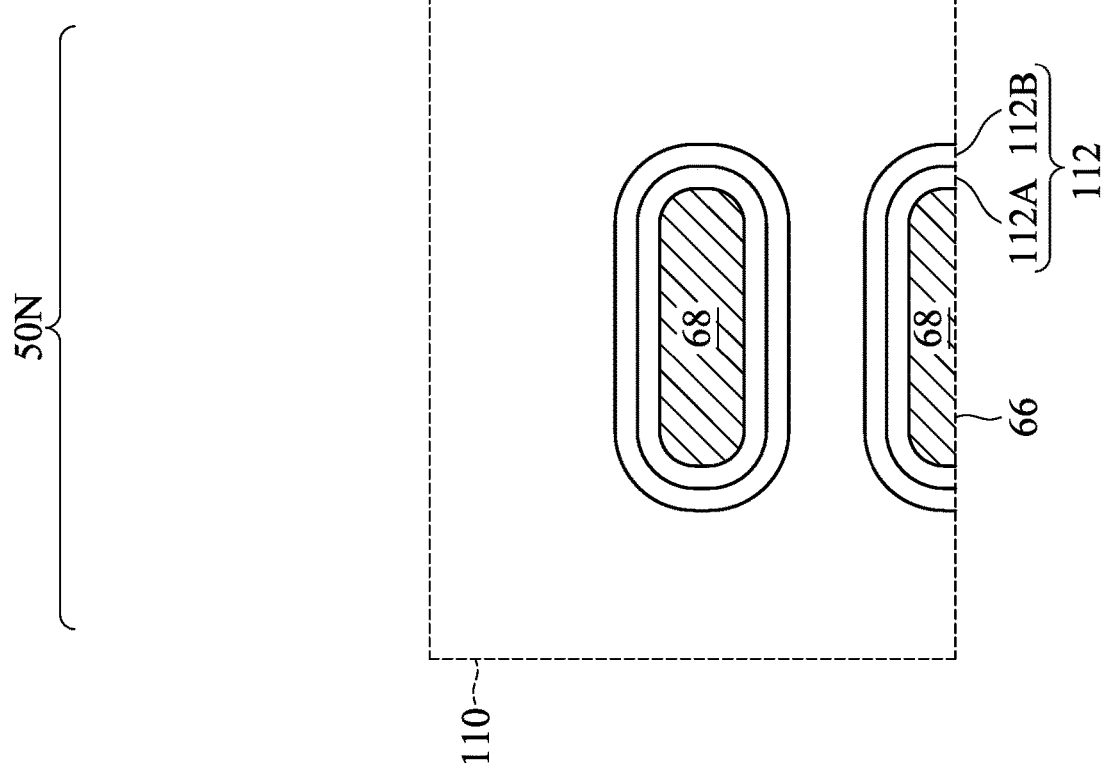

In FIGS. 19A and 19B, the first mask layer 118A is patterned to remove the first mask layer 118A from the recesses 110 in the second region 50P. The first mask layer 118A may be removed by plasma ashing, an etching process such as an isotropic or an anisotropic etching process, or the like. After removing the first mask layer 118A from the recesses 110 in the second region 50P, the second sacrificial layer 116B is removed from the second region 50P. The removal may be by acceptable photolithography and etching techniques. The etching may include any acceptable etch process, such as a RIE, NBE, the like, or a combination thereof. The etching may be anisotropic.

In some embodiments, a single etch is performed to remove the second sacrificial layers 116B. The single etch may be selective to the materials of the second sacrificial layer 116B (e.g., selectively etches the materials of the second sacrificial layer 116B at a faster rate than the material (s) of the gate dielectric layer 112 and/or the first sacrificial layer 116A). In some embodiments, multiple etch steps/processes are performed to remove the second sacrificial layer 116B.

As illustrated in FIGS. 19A and 19B, the removal the second sacrificial layer 116B removes outer portions of the second sacrificial layer 116B to expose portions of the gate dielectric layer 112 but leaves the first sacrificial layer 116A between vertically adjacent ones of the nanostructures 66 and extending between the nanostructures 66 and the fins 62 in both the second region 50P. This removal of outer portions of the second sacrificial layer 116B while leaving inner portions may be referred to as a trimming process.

Figure 20B:
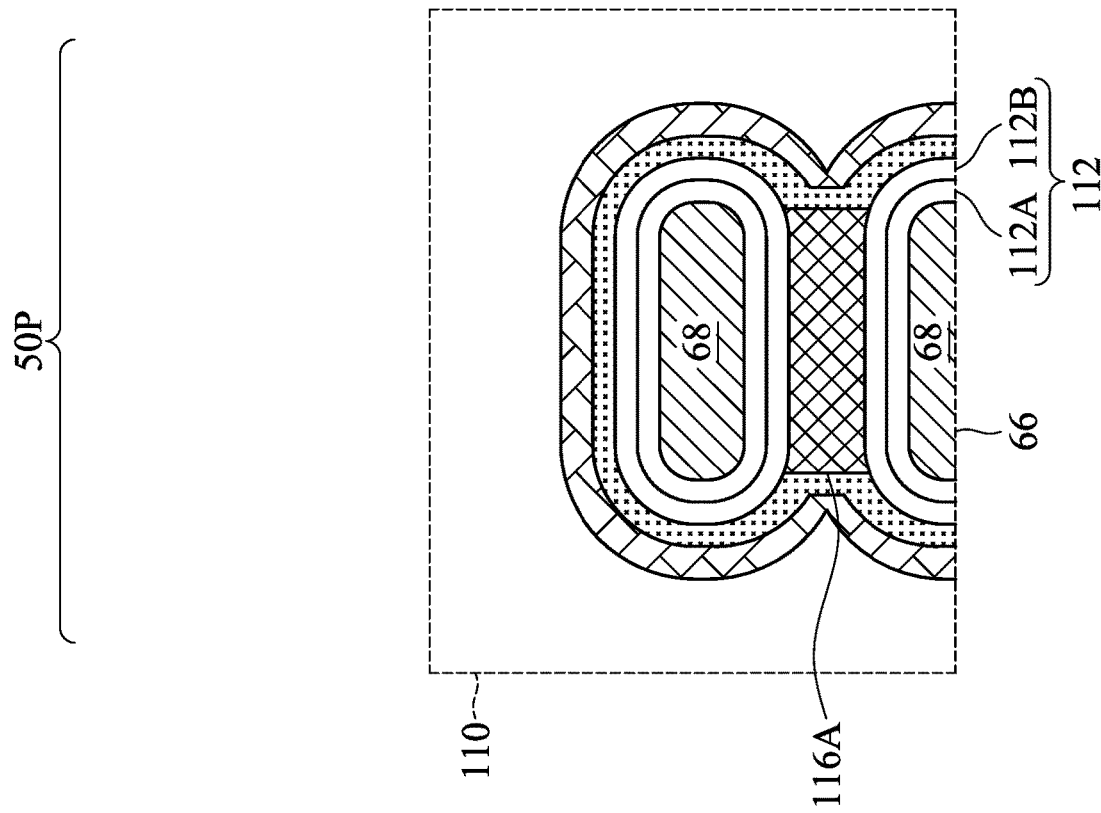
Figure 20A:
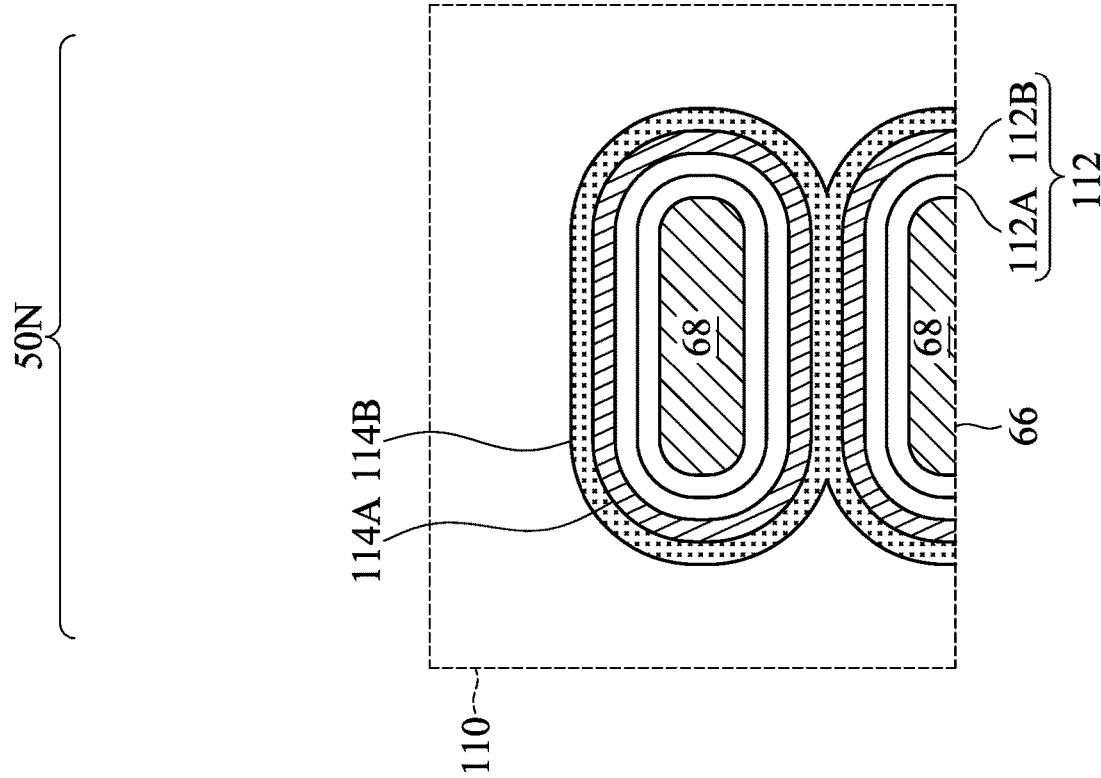

In FIGS. 20A and 20B and step 214 of the method 200, a first work function tuning layer 114A is deposited on the gate dielectric layer 112 in the first region (e.g., the n-type region 50N) and on the gate dielectric layer 112 and the first sacrificial layer 116A in the second region (e.g., the p-type region 50P). As will be subsequently described in greater detail, the first work function tuning layer 114A will be patterned to remove portions of the first work function tuning layer 114A in the second region (e.g., the p-type region 50P) while leaving portions of the first work function tuning layer 114A in the first region (e.g., the n-type region 50N). The first work function tuning layer 114A may be referred to as an "n-type work function tuning layer" when it is removed from the second region (e.g., the p-type region 50P). The first work function tuning layer 114A includes any acceptable material to tune a work function of a device to a desired amount given the application of the device to be formed, and may be deposited using any acceptable deposition process. For example, when the first work function tuning layer 114A is a n-type work function tuning layer, it may be formed of a n-type work function metal (NWFM) such as titanium aluminum (TiAl), titanium aluminum carbide (TiAlC), TiAlC:N, titanium aluminum nitride (TiAlN), tantalum silicon aluminum (TaSiAl), $WCl_5$, $SnCl_4$, $NbCl_5$, $MoCl_4$, combinations thereof, or the like, which may be deposited by ALD, CVD, PVD, or the like. Although the first work function tuning layer 114A is shown as being single layered, the first work function tuning layer 114A can be multilayered. For example, the first work function tuning layer 114A can include a layer of TiAlN and a layer of TiAlC.

The first work function tuning layer 114A is formed to a thickness that does not cause merging of the portions of the first work function tuning layer 114A between the second nanostructures 66 in the first region (e.g., the n-type region 50N). As described in more detail below, the ALD process used to form the first work function tuning layer 114A allows for a thinner first work function tuning layer 114A (that does not merge between second nanostructures 66 in the illustrated cross-section in the first region 50N) while also having the desired effective work function value. The first work function tuning layer 114A cannot merge between the second nanostructures 66 in the second region (e.g., the p-type region 50P) in the illustrated cross-section due to the remaining portions of the first sacrificial layer 116A in the second region. By not depositing the first work function tuning layer 114A between the second nanostructures 66 in the second region (e.g., the p-type region 50P), manufacturing ease can be improved, particularly in advanced semiconductor nodes with small feature sizes, as work function tuning layer materials can be difficult to remove from small spaces. In some embodiments, the first work function tuning layer 114A is formed to a thickness in a range from 5 Å to 120 Å, such as in a range from 20 Å to 80 Å.

In some embodiments, the first work function tuning layer 114A is formed of titanium aluminum carbide, which is deposited by an ALD process. Specifically, the first work function tuning layer 114A may be formed by placing the substrate 50 in a deposition chamber and cyclically dispensing multiple source precursors into the deposition chamber. A first pulse of an ALD cycle is performed by dispensing a titanium source precursor into the deposition chamber. Acceptable titanium source precursors include titanium chloride ($TiCl_4$) or the like. The first pulse can be performed at a temperature in the range of 100° C. to 600° C. and at a pressure in the range of 1 torr to 100 torr, e.g., by maintaining the deposition chamber at such a temperature and pressure. The first pulse can be performed for a duration in the range of 0.5 seconds to 20 seconds, e.g., by keeping the titanium source precursor in the deposition chamber for such a duration. The titanium source precursor is then purged from the deposition chamber, such as by an acceptable vacuuming process and/or by flowing an inert gas (sometimes called a carrier gas) into the deposition chamber. A second pulse of the ALD cycle is performed by dispensing an aluminum source precursor into the deposition chamber. Acceptable aluminum source precursors include triethylaluminium (TEA) ($Al_2(C_2H_5)_6$) and the like. The second pulse can be performed at a temperature in the range of 100° C. to 600° C. and at a pressure in the range of 1 torr to 100 torr, e.g., by maintaining the deposition chamber at such a temperature and pressure. The second pulse can be performed for a duration in the range of 0.5 seconds to 20 seconds, e.g., by keeping the aluminum source precursor in the deposition chamber for such a duration. The aluminum source precursor is then purged from the deposition chamber, such as by an acceptable vacuuming process and/or by flowing an inert gas into the deposition chamber. Performing either of the ALD pulses at a temperature higher than 600° C. may negatively impact the uniformity of the deposition and have inconsistent concentration of materials in the deposited layer. Performing either of the ALD pulses at a temperature less than 100° C. may negatively impact throughput and/or productivity of the manufacturing process and may lead to a higher cost of manufacturing. Each ALD cycle results in the deposition of an atomic layer (sometimes called a monolayer) of titanium aluminum carbide. The ALD cycles are repeated until the first work function tuning layer 114A has a desired thickness (previously described). The ALD cycles can be repeated from 1 to 10 times. Performing the ALD process with parameters in these ranges allows the first work function tuning layer 114A to be formed to a desired thickness (previously described), quality, and composition. Performing the ALD process with parameters outside of these ranges may not allow the first work function tuning layer 114A to be formed to the desired thickness, quality, or composition.

The above-described ALD process for forming the first work function tuning layer 114A has the same number of titanium pulses as aluminum pulses in each ALD cycle. In some embodiments, there are more aluminum pulses than titanium pulses per ALD cycle. For example, each ALD cycle could include one titanium pulse and two aluminum pulses. As another example, each ALD cycle could include two titanium pulse and three aluminum pulses. By ensuring that there are at least as many aluminum pulses as titanium pulses in each ALD cycle, the first work function layer has a higher aluminum concentration. In some embodiments, the atomic percentage (at %) of aluminum in the first work function tuning layer 114A is in a range from 3% to 80%, such as in a range from 20% to 40%. In some embodiments, the first work function tuning layer 114A has a gradient metal concentration with a higher concentration of aluminum at an inner portion near the second nanostructures 66 and a lower concentration at an outer portion away from the second nanostructures 66. In some embodiments, the disclosed method of forming the first work function tuning layer 114A has improved the effective work function by 10% to 15%.

In some embodiments, the ALD process for forming the first work function tuning layer 114A includes flowing a carrier gas from a port on the bottom of the deposition chamber (e.g., below or on the back side of the substrate 50) whereas the titanium and aluminum precursors described above are flowed into one or more ports on the top of the deposition chamber (e.g., above or on the front side of the substrate 50). In some embodiments, the carrier gas flowed into the bottom of the deposition chamber is $N_2$ or the like and at a flow rate in a range from 2 sccm to 100 sccm. In some embodiments, the carrier flow is a pulse performed at the end of each ALD cycle. In some embodiments, the carrier flow is a pulse performed after each titanium or aluminum precursor pulse in each ALD cycle. By including this back side carrier flow in the ALD process, the uniformity of the deposition thickness of the first work function tuning layer 114A is improved by 23% as compared to not including the back side carrier flow.

Further in FIGS. 20A and 20B and step 214 of the method 200, a glue layer 114B is formed on the first work function tuning layer 114A in the first region (e.g., the n-type region 50N) and the second region (e.g., the p-type region 50P). As illustrated in FIG. 20A, the glue layer 114B merges between adjacent second nanostructures 66 in the first region 50N in the illustrated cross-section. In some embodiments, the glue layer 114B is formed to a thickness in a range from 10 nm to 50 nm. The glue layer 114B includes any acceptable material to promote adhesion and prevent diffusion. For example, the glue layer 114B may be formed of a metal or metal nitride such as titanium nitride, titanium aluminum carbide, tantalum aluminum carbide, silicon-doped tantalum aluminide, or the like, which may be deposited by ALD, CVD, PVD, or the like.

In some embodiments, the glue layer 114B is formed by a similar ALD process with titanium precursors, such as $TiCl_4$ or the like, tantalum precursors, such as pentakis (dimethylamido)tantalum (PDMAT) ($C_{10}H_{30}N_5Ta$), tantalum chloride ($TaCl_5$), or the like, and/or nitrogen precursors such as $NH_3$, or the like. The titanium or tantalum precursors may be flowed into the deposition chamber at flow rates in a range from 50 sccm to 100 sccm. The nitrogen precursors may be flowed into the deposition chamber at flow rates in a range from 50 sccm to 50,000 sccm. Performing the ALD process at flow rates higher than the ranges may negatively impact the uniformity of the deposition and result in waste of the precursor. Performing the ALD process at flow rates less than the ranges may negatively impact throughput and/or productivity of the manufacturing process and may lead to a lower concentration of material in the deposited layer. In some embodiments, the ALD process can be performed at a temperature in the range of 100° C. to 600° C. and at a pressure in a range from 0.0001 torr to 1 torr. Performing the ALD process at a temperature higher than 600° C. may negatively impact the uniformity of the deposition and have inconsistent concentration of materials in the deposited layer. Performing the ALD process at a temperature less than 100° C. may negatively impact throughput and/or productivity of the manufacturing process and may lead to a higher cost of manufacturing.

Figure 21B:
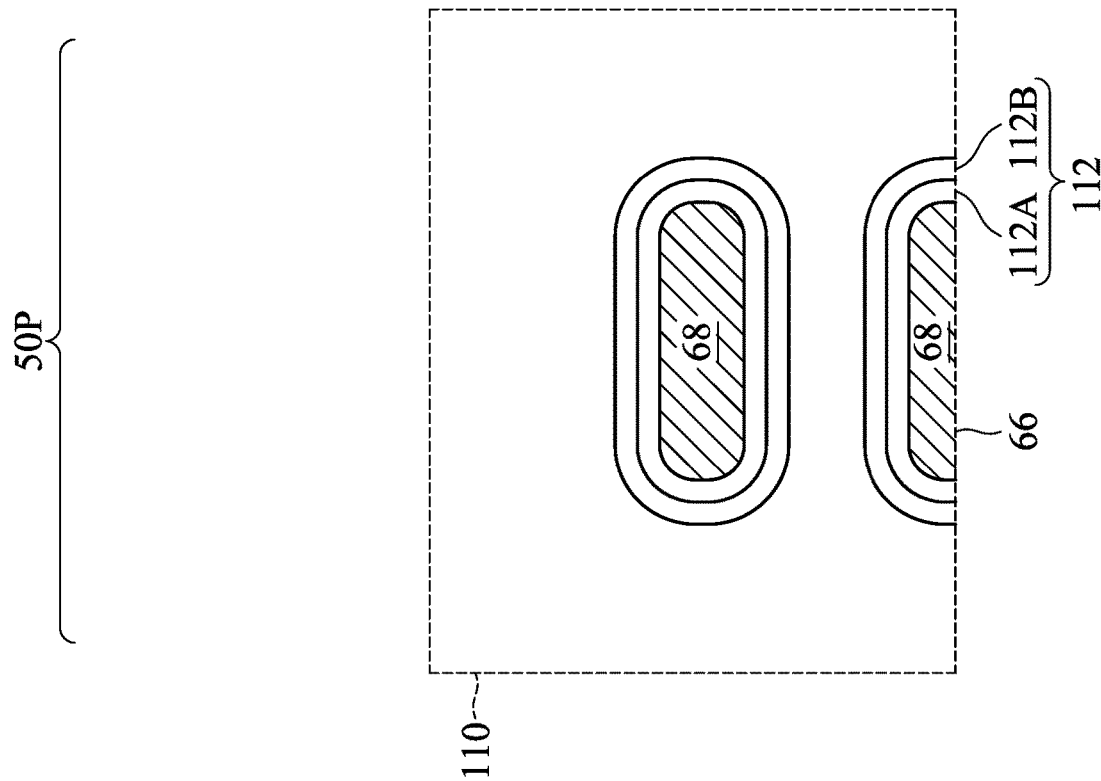
Figure 21A:
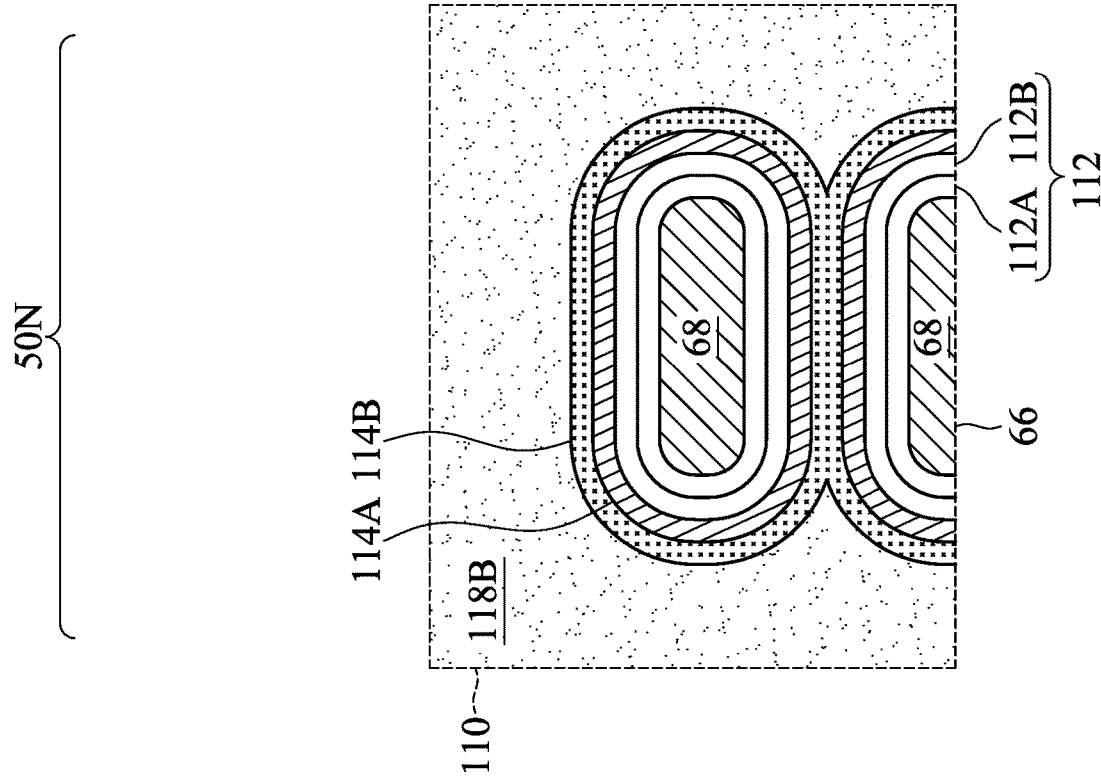

In FIGS. 21A and 21B and step 216 of the method 200, a second mask layer 118B is formed in the second recesses 110 over the glue layer 114B in the first and second regions 50N and 50P. The second mask layer 118B may be similar to the first mask layer 118A described above and the description is not repeated herein.

As illustrated in FIGS. 21A and 21B, the second mask layer 118B is patterned to remove the second mask layer 118B from the recesses 110 in the second region 50P. The second mask layer 118B may be removed by plasma ashing, an etching process such as an isotropic or an anisotropic etching process, or the like. After patterning the second mask layer 118B, the first work function tuning layer 114A, the glue layer 114B, and remaining portions of the first sacrificial layer 116A are removed from the second region 50P using the second mask layer 118B as a mask. Removing the first work function tuning layer 114A, the glue layer 114B, and remaining portions of the first sacrificial layer 116A from the second region (e.g., the p-type region 50P) expands the recesses 110 in the second region to re-expose the gate dielectric layer 112 in the second region (e.g., the p-type region 50P). The removal may be by acceptable photolithography and etching techniques. The etching may include any acceptable etch process, such as a RIE, NBE, the like, a wet etch using for example, ammonium hydroxide ($NH_4OH$), dilute hydrofluoric (dHF) acid, the like, or a combination thereof. The etching may be isotropic.

In some embodiments, a single etch is performed to remove the first work function tuning layer 114A, the glue layer 114B, and remaining portions of the first sacrificial layer 116A. The single etch may be selective to the materials of the first work function tuning layer 114A, the glue layer 114B, and remaining portions of the first sacrificial layer 116A (e.g., selectively etches the materials of the first work function tuning layer 114A, the glue layer 114B, and remaining portions of the first sacrificial layer 116A at a faster rate than the material(s) of the gate dielectric layer 112). In some embodiments, multiple etch steps/processes are performed to remove the first work function tuning layer 114A, the glue layer 114B, and remaining portions of the first sacrificial layer 116A. As discussed before, the remaining portions of the first sacrificial layer 116A are easier to remove from between the second nanostructures 66 than the work function tuning layers, and thus, the disclosed method provides better control for tuning the threshold voltage of the devices.

Figure 22B:
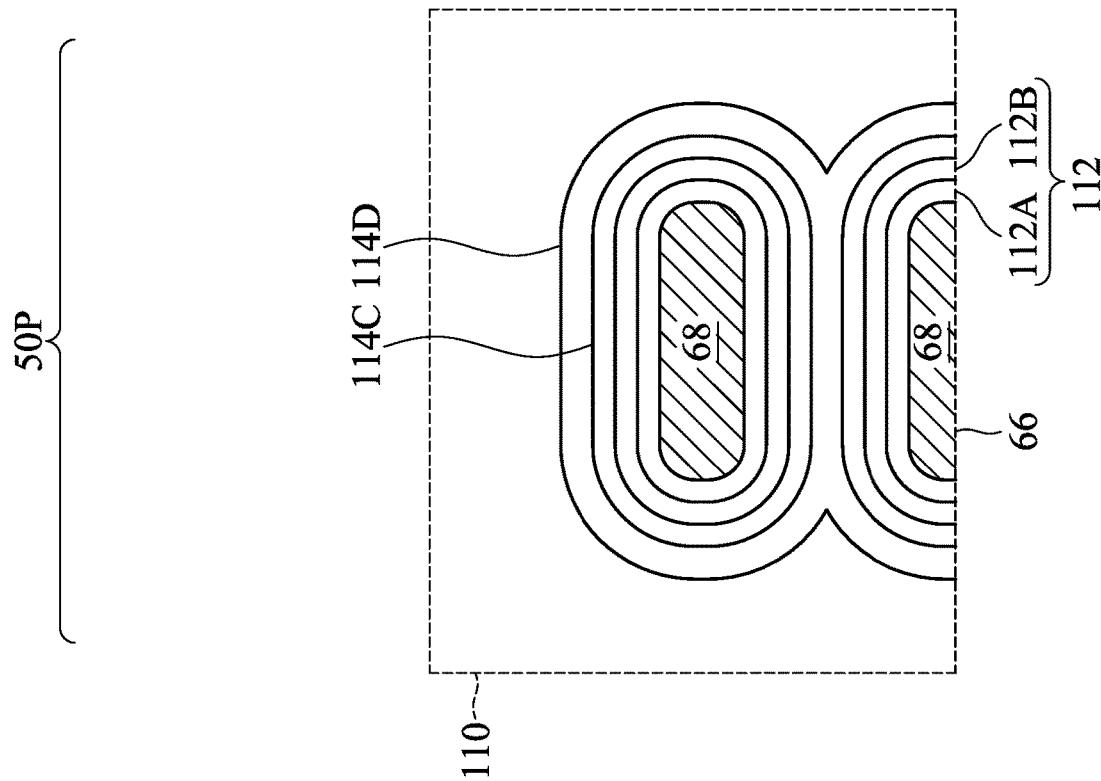
Figure 22A:
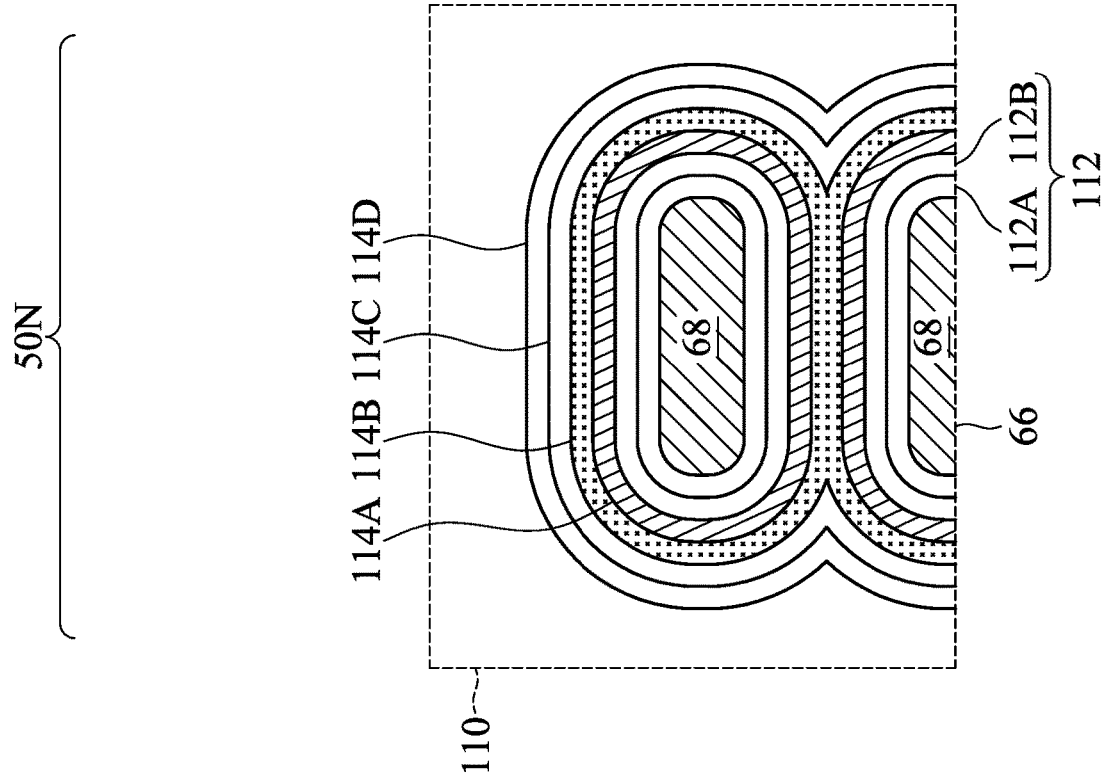

In FIGS. 22A and 22B, the second mask layer 118B is patterned to remove the second mask layer 118B from the recesses 110 in the first region 50N. The second mask layer 118B may be removed by plasma ashing, an etching process such as an isotropic or an anisotropic etching process, or the like.

After removing the second mask layer 118B from the recesses 110 in the second region 50N, in FIGS. 22A and 22B and step 218 of the method 200, a second work function tuning layers 114C and 114D are deposited on the glue layer 114B in the first region (e.g., the n-type region 50N) and on the gate dielectric layer 112 in the second region (e.g., the p-type region 50P). As will be subsequently described in greater detail, p-type devices will be formed having the second work function tuning layers 114C and 114D in the second region (e.g., the p-type region 50P), and n-type devices will be formed having the first work function tuning layer 114A, the glue layer 114B, and the second work function tuning layers 114C and 114D in the first region (e.g., the n-type region 50N). The second work function tuning layers 114C and 114D may be referred to as a "p-type work function tuning layers" when it is the only work function tuning layer in the second region (e.g., the p-type region 50P). The second work function tuning layers 114C and 114D includes any acceptable material to tune a work function of a device to a desired amount given the application of the device to be formed, and may be deposited using any acceptable deposition process. For example, when the second work function tuning layers 114C and 114D are p-type work function tuning layers, it may be formed of a p-type work function metals (PWFM) such as titanium nitride (TiN), tantalum nitride (TaN), combinations thereof, or the like, which may be deposited by ALD, CVD, PVD, or the like. The second work function tuning layers 114C and 114D may be formed by an ALD process using parameters as described above for the glue layer 114B and the description is not repeated herein. Although the second work function tuning layers 114C and 114D are shown as being two layers, the second work function tuning layer can be single-layered or have more than two layers. In some embodiments, the second work function tuning layers 114C and 114D include a layer of titanium nitride (TiN) and a layer of tantalum nitride (TaN).

The second work function tuning layers 114C and 114D are formed to a thickness that is sufficient to cause merging of the portions of the second work function tuning layer 114C or 114D between the second nanostructures 66 in the second region (e.g., the p-type region 50P). In some embodiments, the second work function tuning layers 114C and 114D are formed to a thickness in a range from 10 Å to 200 Å, such as in a range from 20 Å to 25 Å. Forming the second work function tuning layer 114C to a thickness of less than 20 Å may not result in merging of portions of the second work function tuning layers 114C and 114D. Forming the second work function tuning layer 114C and 114D to a thickness of greater than 25 Å may negatively impact the threshold voltages of the resulting devices.

The material of the first work function tuning layer 114A is different from the material of the second work function tuning layers 114C and 114D. As noted above, the first work function tuning layer 114A can be formed of a n-type work function metal (NWFM) and the second work function tuning layers 114C and 114D can be formed of p-type work function metal (PWFM). The NWFM is different from the PWFM.

Figure 23B:
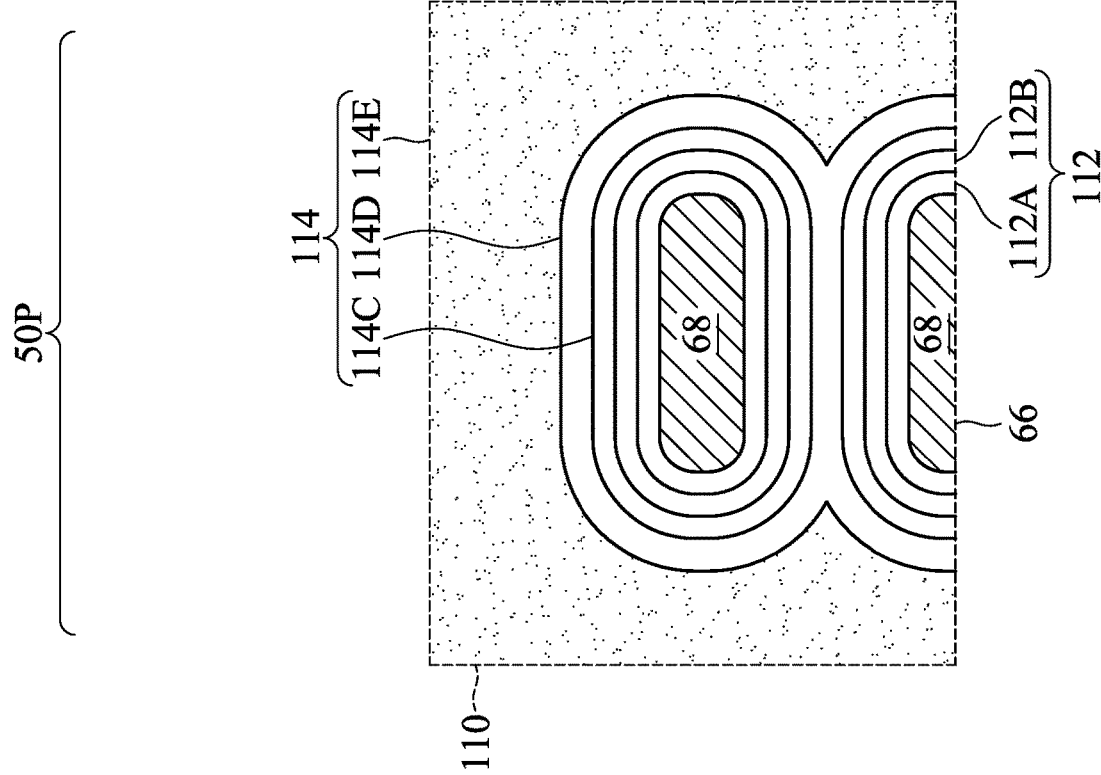
Figure 23A:
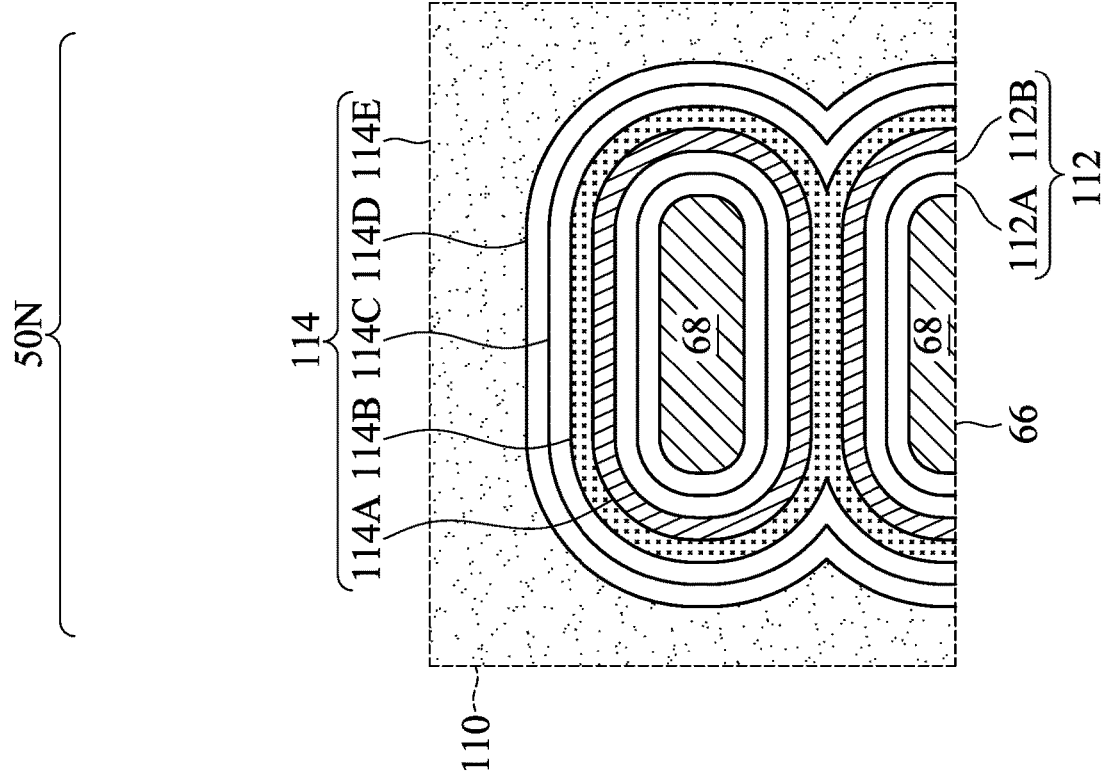

In FIGS. 23A and 23B and step 220 of the method 200, a fill layer 114E is deposited on the second work function tuning layer 114D. After formation is complete, the gate electrode layer 114 includes the first work function tuning layer 114A, the glue layer 114B, the second work function tuning layers 114C and 114D, and the fill layer 114E.

The fill layer 114E includes any acceptable material of a low resistance. For example, the fill layer 114E may be formed of a metal such as tungsten, aluminum, cobalt, ruthenium, combinations thereof or the like, which may be deposited by ALD, CVD, PVD, or the like. The fill layer 114E fills the remaining portions of the recesses 110. As illustrated in the cross-sections in FIGS. 23A and 23B, the fill layer 114E does not extend between adjacent second nanostructures 66 in either the first region 50N or the second region 50P as the area between adjacent second nanostructures 66 in both regions has already been filled by other layers.

Although the glue layer 114B is used promote adhesion and prevent diffusion of the first work function tuning layer 114A during processing, it may not significantly affect the electrical characteristics of the resulting devices, and may be left in the portions of the gate electrode layer 114 in the first region (e.g., the n-type region 50N). The glue layer 114B is disposed between and physically separates the portions of the first work function tuning layer 114A and the second work function tuning layer 114C in the first region (e.g., the n-type region 50N). Conversely, the second region (e.g., the p-type region 50P) is free of the first work function tuning layer 114A and the glue layer 114B, such that the second work function tuning layer 114C and the gate dielectric layer 112 in the second region (e.g., the p-type region 50P) are not separated by a glue layer, and may be in physical contact.

Figure 24B:
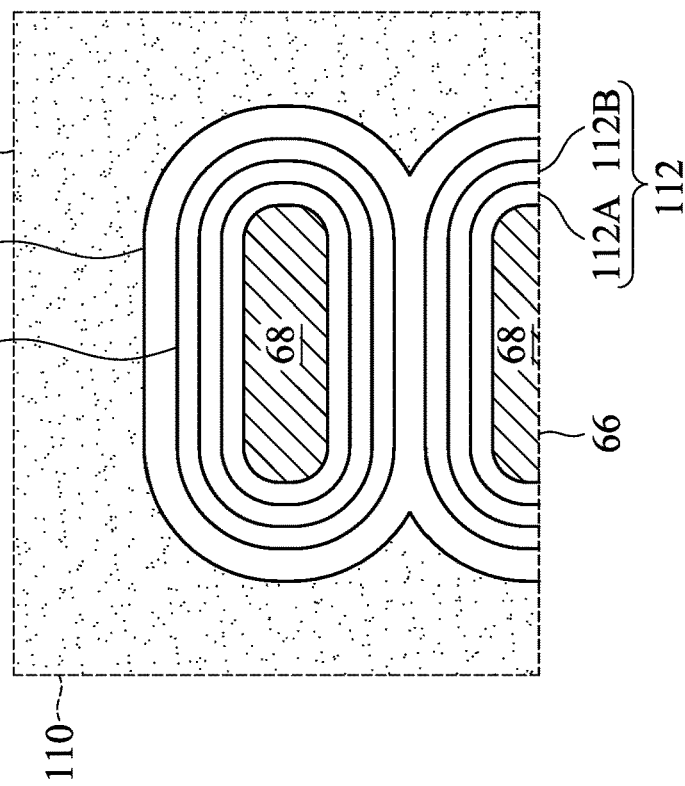
Figure 24A:
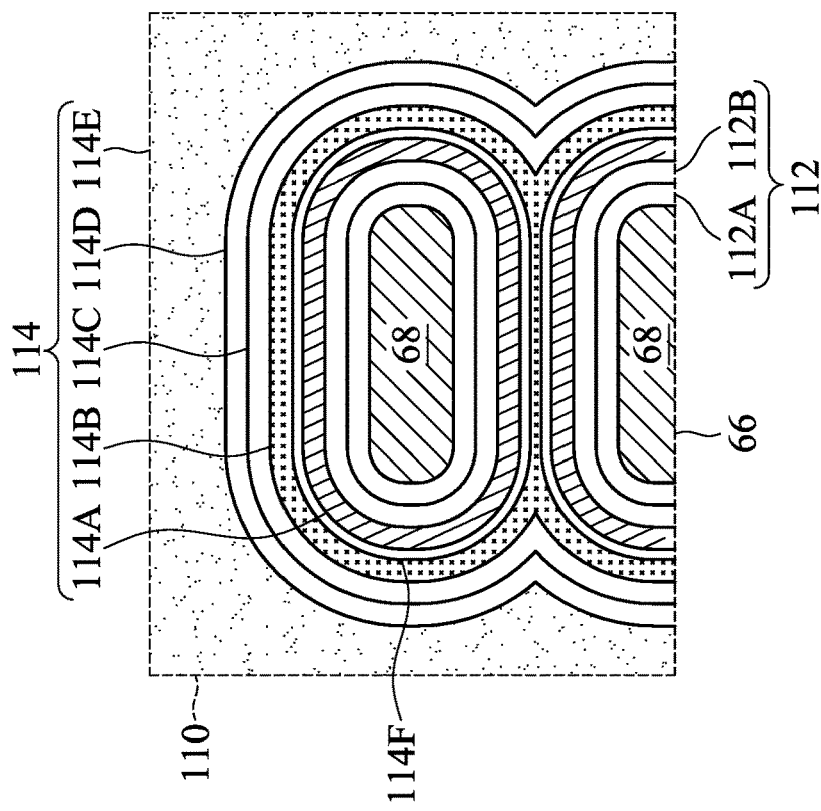

FIGS. 24A and 24B illustrate an embodiment that includes a protective layer 114F between the first work function tuning layer 114A and the glue layer 114B. The protective layer 114F is formed of a material that is resistant to oxidation and prevents diffusion of the first work function tuning layer 114A, and thus, inhibits the modification of the first work function tuning layer 114A by subsequent processing.

In some embodiments, the protective layer 114F is formed of amorphous silicon, tantalum nitride, titanium nitride, the like, or a combination thereof which may be deposited by CVD, ALD, or the like. Although the protective layer 114F is shown as being single layered, the protective layer 114F can be multilayered. For example, the protective layer 114F can include a layer of amorphous silicon and a layer of titanium nitride. In some embodiments, the protective layer 114F is formed to a thickness in a range from 0.1 nm to 10 nm.

Figure 25B:
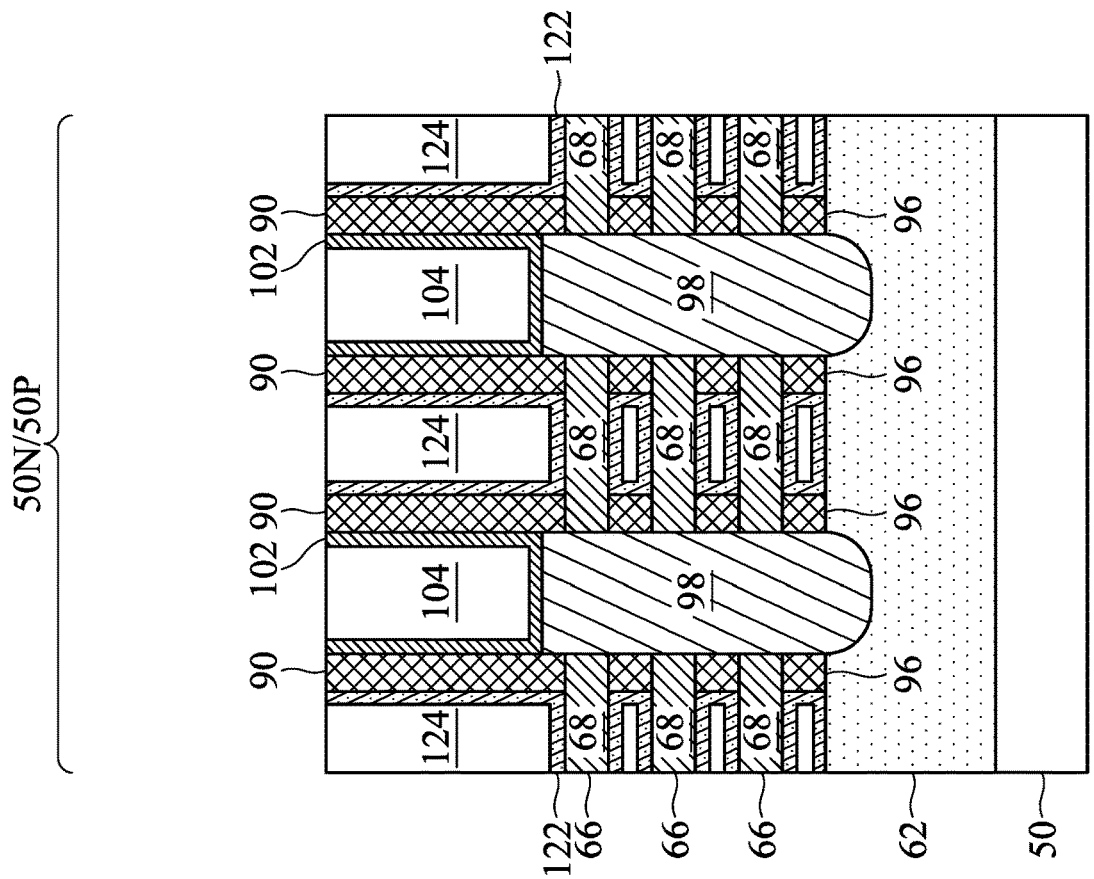
Figure 25A:
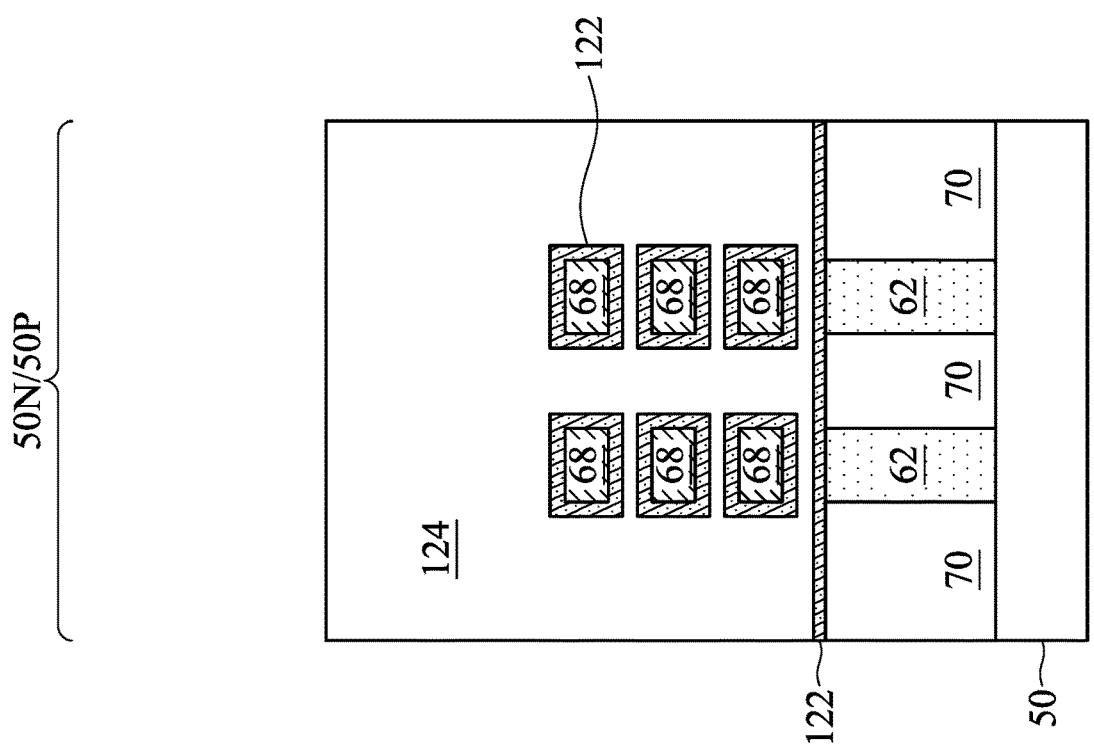

In FIGS. 25A and 25B, a removal process is performed to remove the excess portions of the materials of the gate dielectric layer 112 and the gate electrode layer 114, which excess portions are over the top surfaces of the first ILD 104 and the gate spacers 90, thereby forming gate dielectrics 122 and gate electrodes 124. In some embodiments, a planarization process such as a chemical mechanical polish (CMP), an etch-back process, combinations thereof, or the like may be utilized. The gate dielectric layer 112, when planarized, has portions left in the recesses 110 (thus forming the gate dielectrics 122). The gate electrode layer 114, when planarized, has portions left in the recesses 110 (thus forming the gate electrodes 124). The top surfaces of the gate spacers 90; the CESL 102; the first ILD 104; the gate dielectrics 122 (e.g., the interfacial layers 112A and the high-k dielectric layers 112B, see FIGS. 23A-24B); and the gate electrodes 124 (e.g., the first work function tuning layer 114A, the glue layer 114B, the second work function tuning layers 114C and 114D, optionally the protective layer 114F, and the fill layer 114E, see FIGS. 23A-24B) are coplanar (within process variations). The gate dielectrics 122 and the gate electrodes 124 form replacement gates of the resulting nano-FETs. Each respective pair of a gate dielectric 122 and a gate electrode 124 may be collectively referred to as a "gate structure." The gate structures each extend along top surfaces, sidewalls, and bottom surfaces of a channel region 68 of the second nanostructures 66.

Figure 26B:
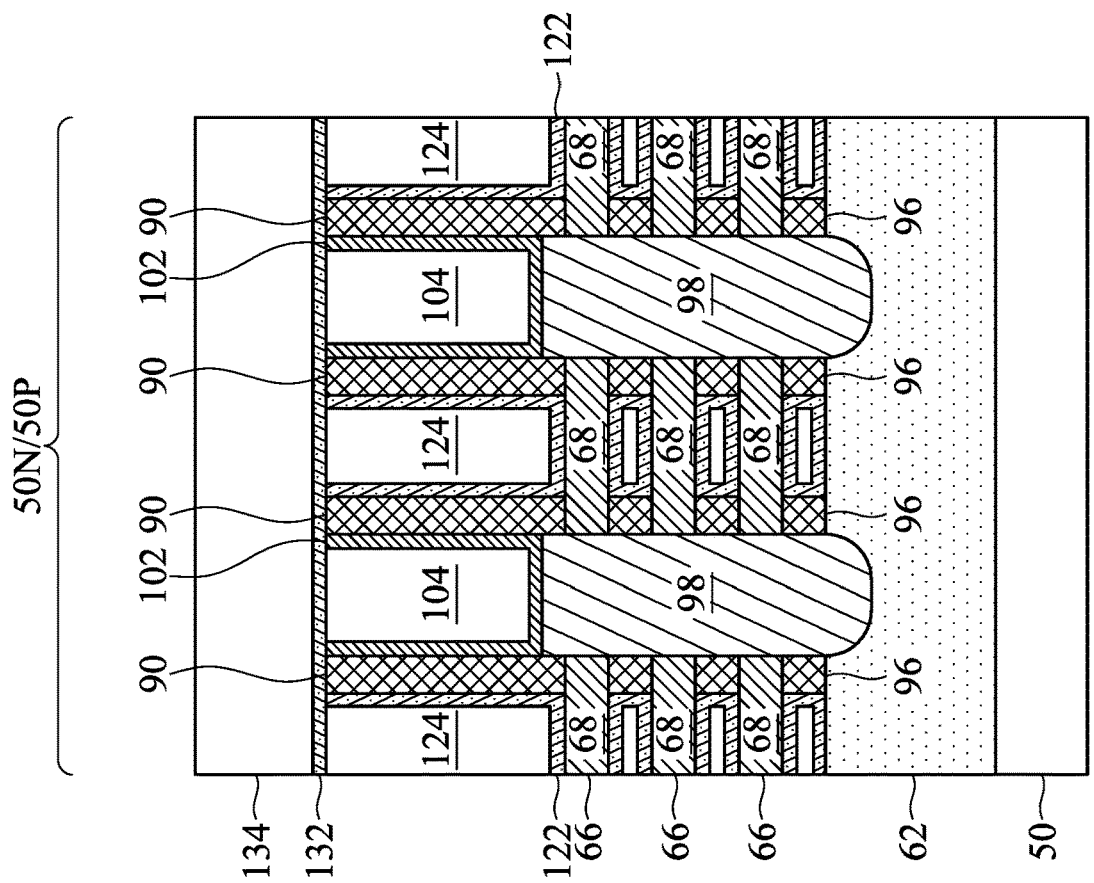
Figure 26A:
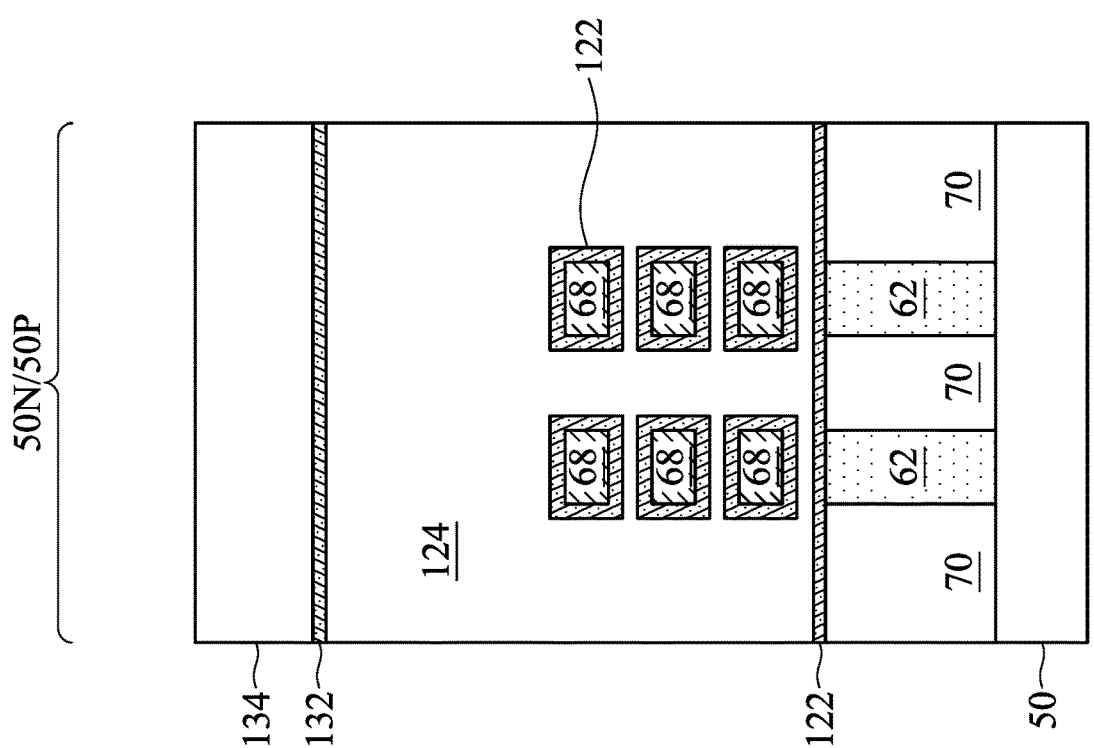

In FIGS. 26A and 26B, a second ILD 134 is deposited over the gate spacers 90, the CESL 102, the first ILD 104, the gate dielectrics 122, and the gate electrodes 124. In some embodiments, the second ILD 134 is a flowable film formed by a flowable CVD method. In some embodiments, the second ILD 134 is formed of a dielectric material such as PSG, BSG, BPSG, USG, or the like, which may be deposited by any suitable method, such as CVD, PECVD, or the like.

In some embodiments, an etch stop layer (ESL) 132 is formed between the second ILD 134 and the gate spacers 90, the CESL 102, the first ILD 104, the gate dielectrics 122, and the gate electrodes 124. The ESL 132 may include a dielectric material, such as, silicon nitride, silicon oxide, silicon oxynitride, or the like, having a high etching selectivity from the etching of the second ILD 134.

Figure 27B:
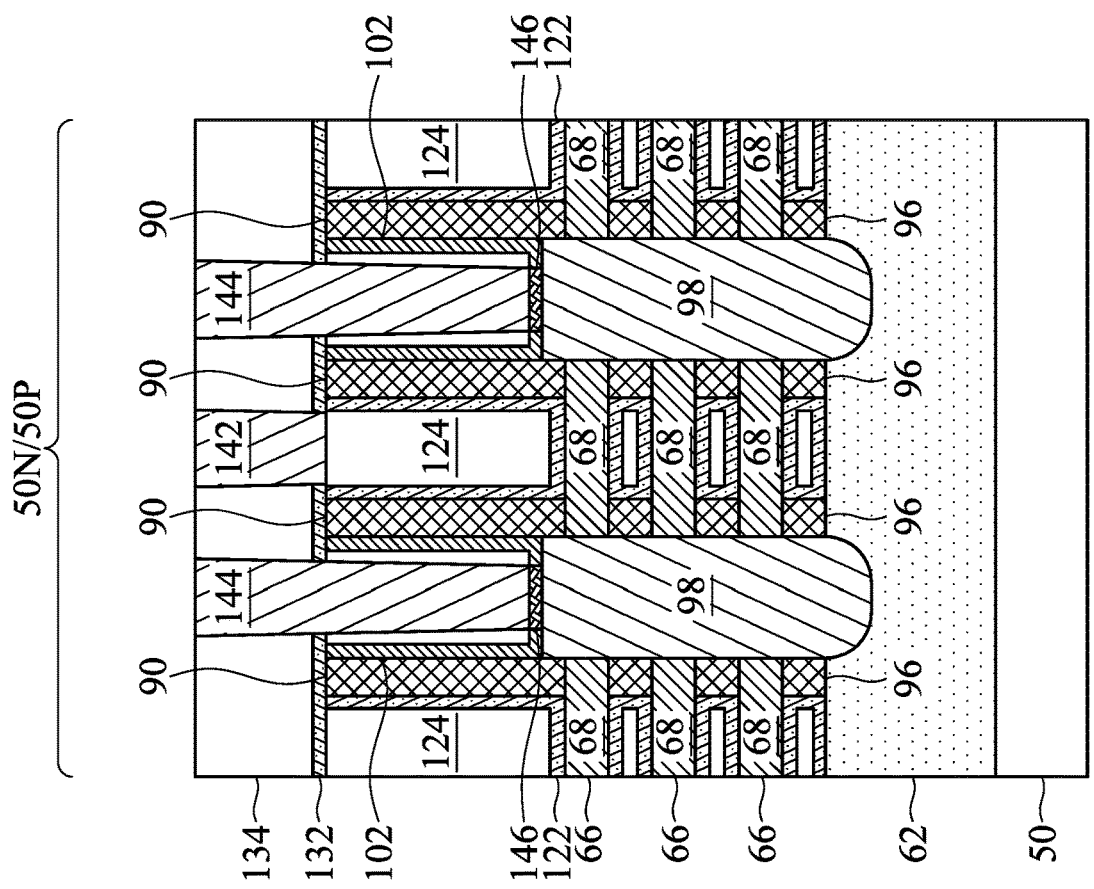
Figure 27A:
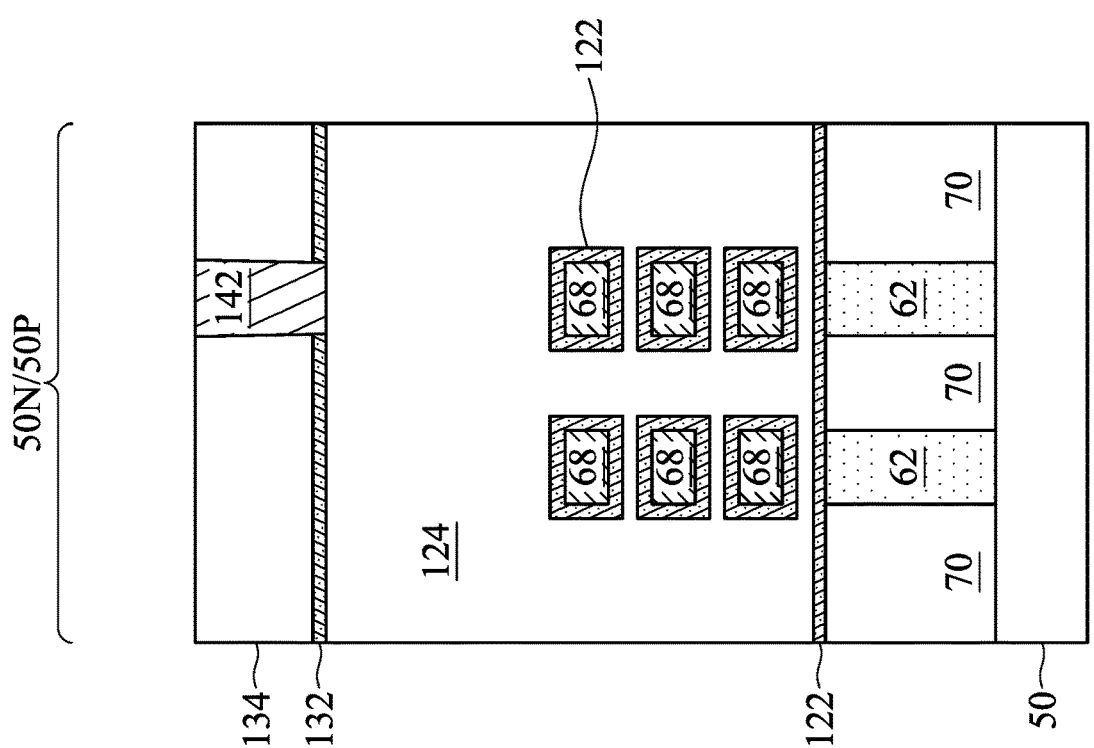

In FIGS. 27A and 27B, gate contacts 142 and source/drain contacts 144 are formed to contact, respectively, the gate electrodes 124 and the epitaxial source/drain regions 98. The gate contacts 142 are physically and electrically coupled to the gate electrodes 124. The source/drain contacts 144 are physically and electrically coupled to the epitaxial source/drain regions 98.

As an example to form the gate contacts 142 and the source/drain contacts 144, openings for the gate contacts 142 are formed through the second ILD 134 and the ESL 132, and openings for the source/drain contacts 144 are formed through the second ILD 134, the ESL 132, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 134. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 98 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

Embodiments may achieve advantages. In some embodiments, the work function tuning layers for the n-type devices are formed before the work function tuning layers for the p-type devices to allow more control of the threshold voltages of the resulting devices. The method of forming the work function tuning layers for the n-type devices before the work function tuning layers for the p-type devices includes the formation and patterning of sacrificial layers to prevent the work function tuning layers for the n-type devices from being formed between the nano structures of the p-type devices. This helps to prevent the work function tuning layers from remaining on the p-type devices which could degrade the performance of the p-type devices. In some embodiments, a protection layer is formed between the work function tuning layer and a glue layer to inhibit (e.g., substantially prevents or at least reduces) diffusion of the work function tuning layer. The threshold voltages of the resulting devices may thus be more accurately tuned.

An embodiment includes a device having a first set of nanostructures on a substrate, the first set of nanostructures including a first channel region. The device also includes a second set of nanostructures on the substrate, the second set of nanostructures including a second channel region. The device also includes a gate dielectric layer wrapping around each of the first and second sets of nanostructures. The device also includes a first work function tuning layer on the gate dielectric layer of the first set of nanostructures, the first work function tuning layer wrapping around each of the first set of nanostructures, the first work function tuning layer including an n-type work function metal. The device also includes a glue layer on the first work function tuning layer, the glue layer wrapping around each of the first set of nanostructures. The device also includes a second work function tuning layer on the glue layer of the first set of nanostructures and on the gate dielectric layer of the second set of nanostructures, the second work function tuning layer including a p-type work function metal, the p-type work function metal different from the n-type work function metal. The device also includes a fill layer on the second work function tuning layer.

Embodiments may include one or more of the following features. The device where the glue layer includes titanium nitride, titanium aluminum carbide, tantalum aluminum carbide, silicon-doped tantalum aluminide. The device further including a protective layer between the first work function tuning layer and the glue layer on the first set of nanostructures, the protective layer wrapping around each of the first set of nanostructures. The protective layer includes amorphous silicon. The glue layer separates and fills an area between respective portions of the protective layer on adjacent nanostructures of the first set of nanostructures. The glue layer separates and fills an area between respective portions of the first work function tuning layer on adjacent nanostructures of the first set of nanostructures. The second work function tuning layer separates and fills an area between respective portions of the gate dielectric layer on adjacent nanostructures of the second set of nanostructures. The fill layer does not extend between adjacent nanostructures of the second set of nanostructures.

An embodiment includes a method including forming a first set of nanostructures and a second set of nanostructures on a substrate, the first set of nanostructures including a first channel region and the second set of nanostructures including a second channel region. The method also includes forming a gate dielectric layer having a first portion and a second portion, the first portion deposited on the first channel region, the second portion deposited on the second channel region. The method also includes forming a first work function tuning layer on the first portion of the gate dielectric layer and the second portion of the gate dielectric layer. The method also includes forming a glue layer on the first work function tuning layer. The method also includes removing the glue layer and the first work function tuning layer from the second portion of the gate dielectric layer. The method also includes forming a second work function tuning layer on the remaining glue layer and the second portion of the gate dielectric layer. The method also includes forming a fill layer on the second work function tuning layer.

Embodiments may include one or more of the following features. The method where the first work function tuning layer includes an n-type work function metal, and where the second work function tuning layer including an p-type work function metal. The method further including before forming the first work function tuning layer, forming a sacrificial layer on the second portion of the gate dielectric layer between adjacent nanostructures of the second set of nanostructures, the first work function layer being formed on the sacrificial layer and the second portion of the gate dielectric layer. Forming the sacrificial layer on the second portion of the gate dielectric layer between adjacent nanostructures of the second set of nanostructures further includes forming a first sacrificial layer on the first portion and the second portion of the gate dielectric layer, trimming the first sacrificial layer to expose portions of the first portion and the second portion of the gate dielectric layer, where after the trimming, portions of the first sacrificial layer remain between adjacent nanostructures of both the first and second sets of nanostructures, forming a second sacrificial layer on the exposed portions of the first portion and the second portion of the gate dielectric layer and the remaining portions of the first sacrificial layer, removing the first and second sacrificial layers from the first set of nanostructures to expose the first portion of the gate dielectric layer, and trimming the second sacrificial layer to expose portions of the second portion of the gate dielectric layer, where after the trimming, portions of the first sacrificial layer remain between adjacent nanostructures of the second set of nanostructures. Forming the first work function tuning layer includes depositing titanium aluminum carbide by an ALD process, the ALD process performed with titanium chloride and triethylaluminium, the ALD process performed at a temperature in a range of 100° C. to 600° C., the ALD process performed at a pressure in a range of 1 torr to 100 torr. The ALD process includes the same number of pulses of titanium chloride and triethylaluminium in each ALD cycle. The ALD process includes more pulses of triethylaluminium than titanium chloride in each ALD cycle. The method further including forming a protective layer on the first work function tuning layer on the first set of nanostructures, the glue layer being formed on the protective layer on the first set of nanostructures. The protective layer includes amorphous silicon.

An embodiment includes a method including forming a first set of nanostructures and a second set of nanostructures on a substrate, the first set of nanostructures including a first channel region and the second set of nanostructures including a second channel region. The method also includes forming a gate dielectric layer on the first channel region. The method also includes forming a second gate dielectric layer on the second channel region. The method also includes forming a sacrificial layer between the second set of nanostructures. The method also includes forming a n-type work function tuning layer on the first gate dielectric layer, the second gate dielectric layer, and the sacrificial layer, the n-type work function tuning layer wrapping around each of the first set of nanostructures. The method also includes forming a glue layer on the n-type work function tuning layer, the glue layer wrapping around each of the first set of nanostructures. The method also includes removing the glue layer, the n-type work function tuning layer, and the sacrificial layer from the second gate dielectric layer. The method also includes forming a p-type work function tuning layer on the glue layer on the first set of nanostructures and the second gate dielectric layer. The method also includes forming a fill layer on the p-type work function tuning layer.

Embodiments may include one or more of the following features. The method where forming a sacrificial layer between the second set of nanostructures further includes forming a first sacrificial layer on the first and second gate dielectric layers, trimming the first sacrificial layer to expose portions of the first and second gate dielectric layers, where after the trimming, portions of the first sacrificial layer remain between adjacent nanostructures of both the first and second sets of nanostructures, forming a second sacrificial layer on the exposed portions of the first and second gate dielectric layers and the remaining portions of the first sacrificial layer, removing the first and second sacrificial layers from the first set of nanostructures to expose the first gate dielectric layer, and trimming the second sacrificial layer to expose portions of the second gate dielectric layer, where after the trimming, portions of the first sacrificial layer remain between adjacent nanostructures of the second set of nanostructures. Forming the n-type work function tuning layer includes depositing titanium aluminum carbide by an ALD process, the ALD process includes performing multiple ALD cycles, where each ALD cycle includes pulses of titanium chloride and triethylaluminium, the ALD process performed at a temperature in a range of 100° C. to 600° C., the ALD process performed at a pressure in a range of 1 torr to 100 torr, where the ALD process includes more pulses of triethylaluminium than titanium chloride in each ALD cycle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first set of nanostructures and a second set of nanostructures on a substrate, the first set of nanostructures comprising a first channel region and the second set of nanostructures comprising a second channel region;
    removing dummy gate structures from the first and second channel regions of the first and second sets of nanostructures;
    after removing the dummy gate structures, forming a gate dielectric layer having a first portion and a second portion, the first portion deposited on the first channel region, the second portion deposited on the second channel region;
    forming a first sacrificial layer on the first portion and the second portion of the gate dielectric layer;
    trimming the first sacrificial layer to expose portions of the first portion and the second portion of the gate dielectric layer, wherein after the trimming, portions of the first sacrificial layer remain between adjacent nanostructures of both the first and second sets of nanostructures;
    forming a first work function tuning layer on the first portion of the gate dielectric layer, the second portion of the gate dielectric layer, and the trimmed first sacrificial layer;
    forming a glue layer on the first work function tuning layer;
    removing the glue layer and the first work function tuning layer from the second portion of the gate dielectric layer;
    forming a second work function tuning layer on the remaining glue layer and the second portion of the gate dielectric layer; and
    forming a fill layer on the second work function tuning layer.

2. The method of claim 1, wherein the first work function tuning layer comprises an n-type work function metal, and wherein the second work function tuning layer comprising an p-type work function metal.

3. The method of claim 1, further comprising
forming a second sacrificial layer on the exposed portions of the first portion and the second portion of the gate dielectric layer and the remaining portions of the first sacrificial layer;
removing the first and second sacrificial layers from the first set of nanostructures to expose the first portion of the gate dielectric layer; and
trimming the second sacrificial layer to expose portions of the second portion of the gate dielectric layer, wherein after the trimming, portions of the first sacrificial layer remain between adjacent nanostructures of the second set of nanostructures.

4. The method of claim 3, wherein after the trimming, portions of the first sacrificial layer merge between adjacent nanostructures of the second set of nanostructures.

5. The method of claim 1, wherein forming the first work function tuning layer comprises depositing titanium aluminum carbide by an ALD process, the ALD process performed with titanium chloride and triethylaluminium, the ALD process performed at a temperature in a range of 100° C. to 600° C., the ALD process performed at a pressure in a range of 1 torr to 100 torr.

6. The method of claim 5, wherein the ALD process comprises the same number of pulses of titanium chloride and triethylaluminium in each ALD cycle.

7. The method of claim 5, wherein the ALD process comprises more pulses of triethylaluminium than titanium chloride in each ALD cycle.

8. The method of claim 1 further comprising:
forming a protective layer on the first work function tuning layer on the first set of nanostructures, the glue layer being formed on the protective layer on the first set of nanostructures.

9. The method of claim 8, wherein the protective layer comprises amorphous silicon.

10. A method comprising:
forming a first set of nanostructures and a second set of nanostructures on a substrate, the first set of nanostructures comprising a first channel region and the second set of nanostructures comprising a second channel region;
removing dummy gate structures from the first and second channel regions of the first and second sets of nanostructures;
after removing the dummy gate structures, forming a first gate dielectric layer on the first channel region;
after removing the dummy gate structures, forming a second gate dielectric layer on the second channel region;
forming a sacrificial layer on the second gate dielectric layer between the second set of nanostructures, the sacrificial layer merging between adjacent nanostructures of the second set of nanostructures;
forming a n-type work function tuning layer on the first gate dielectric layer, the second gate dielectric layer, and the sacrificial layer, the n-type work function tuning layer wrapping around each of the first set of nanostructures;
forming a glue layer on the n-type work function tuning layer, the glue layer wrapping around each of the first set of nanostructures;
removing the glue layer, the n-type work function tuning layer, and the sacrificial layer from the second gate dielectric layer;
forming a p-type work function tuning layer on the glue layer on the first set of nanostructures and the second gate dielectric layer; and
forming a fill layer on the p-type work function tuning layer.

11. The method of claim 10, wherein forming a sacrificial layer between the second set of nanostructures further comprises:
forming a first sacrificial layer on the first and second gate dielectric layers;
trimming the first sacrificial layer to expose portions of the first and second gate dielectric layers, wherein after the trimming, portions of the first sacrificial layer remain between adjacent nanostructures of both the first and second sets of nanostructures;
forming a second sacrificial layer on the exposed portions of the first and second gate dielectric layers and the remaining portions of the first sacrificial layer;
removing the first and second sacrificial layers from the first set of nanostructures to expose the first gate dielectric layer; and
trimming the second sacrificial layer to expose portions of the second gate dielectric layer, wherein after the trimming, portions of the first sacrificial layer remain between adjacent nanostructures of the second set of nanostructures.

12. The method of claim 10, wherein forming the n-type work function tuning layer comprises depositing titanium aluminum carbide by an ALD process, the ALD process comprises performing multiple ALD cycles, wherein each ALD cycle comprises pulses of titanium chloride and triethylaluminium, the ALD process performed at a temperature in a range of 100° C. to 600° C., the ALD process performed at a pressure in a range of 1 torr to 100 torr, wherein the ALD process comprises more pulses of triethylaluminium than titanium chloride in each ALD cycle.

13. A method comprising:
forming a first set of nanostructures on a substrate, the first set of nanostructures comprising a first channel region;
forming a second set of nanostructures on the substrate, the second set of nanostructures comprising a second channel region;
removing dummy gate structures from the first and second channel regions of the first and second sets of nanostructures;
forming a gate dielectric layer wrapping around each of the first and second sets of nanostructures;
forming a sacrificial layer between the second set of nanostructures, the sacrificial layer merging between adjacent nanostructures of the second set of nanostructures;
forming a first work function tuning layer on the gate dielectric layer of the first set of nanostructures, the first work function tuning layer wrapping around each of the first set of nanostructures, the first work function tuning layer comprising an n-type work function metal;
forming a glue layer on the first work function tuning layer and the sacrificial layer, the glue layer wrapping around each of the first set of nanostructures, the glue layer only partially wrapping around the second set of nanostructures;
forming a second work function tuning layer on the glue layer of the first set of nanostructures and on the gate dielectric layer of the second set of nanostructures, the second work function tuning layer comprising a p-type work function metal, the p-type work function metal different from the n-type work function metal; and forming a fill layer on the second work function tuning layer.

14. The method of claim 13, wherein the glue layer comprises titanium nitride, titanium aluminum carbide, tantalum aluminum carbide, silicon-doped tantalum aluminide.

15. The method of claim 13 further comprising:
forming a protective layer between the first work function tuning layer and the glue layer on the first set of nanostructures, the protective layer wrapping around each of the first set of nanostructures.

16. The method of claim 15, wherein the protective layer comprises amorphous silicon.

17. The method of claim 16, wherein the glue layer separates and fills an area between respective portions of the protective layer on adjacent nanostructures of the first set of nanostructures.

18. The method of claim 13, wherein the glue layer separates and fills an area between respective portions of the first work function tuning layer on adjacent nanostructures of the first set of nanostructures.

19. The method of claim 13, wherein the second work function tuning layer separates and fills an area between respective portions of the gate dielectric layer on adjacent nanostructures of the second set of nanostructures.

20. The method of claim 13, wherein the fill layer does not extend between adjacent nanostructures of the second set of nanostructures.

* * * * *